(12) United States Patent
Huang et al.

(10) Patent No.: US 12,069,909 B2
(45) Date of Patent: Aug. 20, 2024

(54) DISPLAY SUBSTRATE OF EVEN-DISTRIBUTED LIGHT EMITTING DEVICES, DISPLAY PANEL AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Weiyun Huang, Beijing (CN); Jianchang Cai, Beijing (CN); Pinchao Gu, Beijing (CN); Yuanyou Qiu, Beijing (CN); Yao Huang, Beijing (CN)

(73) Assignees: Chengdu BOE Optoelectronics Technology Co., Ltd., Chengdu (CN); BOE Technology Group Co., Ltd., Beijing (CN)

(*) Notice: Subject to any disclaimer, the term of this patent is extended or adjusted under 35 U.S.C. 154(b) by 583 days.

(21) Appl. No.: 17/299,356

(22) PCT Filed: Sep. 30, 2020

(86) PCT No.: PCT/CN2020/119159
§ 371 (c)(1),
(2) Date: Jun. 3, 2021

(87) PCT Pub. No.: WO2022/061952
PCT Pub. Date: Mar. 31, 2022

(65) Prior Publication Data
US 2022/0320187 A1    Oct. 6, 2022

(30) Foreign Application Priority Data
Sep. 24, 2020  (WO) ............... PCT/CN2020/117373

(51) Int. Cl.
*H10K 59/131*  (2023.01)
*G09G 3/3225*  (2016.01)
(Continued)

(52) U.S. Cl.
CPC ......... *H10K 59/131* (2023.02); *G09G 3/3225* (2013.01); *G09G 3/3266* (2013.01);
(Continued)

(58) Field of Classification Search
CPC ...................... H10K 59/1315; H10K 59/121
(Continued)

(56) References Cited

U.S. PATENT DOCUMENTS 8,159,117 B2    4/2012  Karaki et al.
2018/0166018 A1  6/2018  Yang
(Continued)

FOREIGN PATENT DOCUMENTS

CN    108735094 A    11/2018
CN    110459175 A    8/2019
(Continued)

OTHER PUBLICATIONS

English Translation of CN 111063719 A (Year: 2020).*
(Continued)

*Primary Examiner* — Xia L Cross
(74) *Attorney, Agent, or Firm* — ArentFox Schiff LLP; Michael Fainberg

(57) ABSTRACT

Disclosure provides a display substrate, a display panel and a display device. The display substrate includes a substrate, a drive circuit layer and a light emitting device layer sequentially on the substrate, a display region of the substrate includes first and second display regions on a side of the first display region, light transmittance of the first display region is larger than that of the second display region; the drive circuit layer includes first pixel circuits in bezel region
(Continued)

around the display region, second pixel circuits in the second display region; the light emitting device layer includes first light emitting devices, second light emitting devices; each first light emitting device is electrically connected with each first pixel circuit; each second light emitting device is electrically connected with each second pixel circuits; a density of the first light emitting devices is same as a density of the second light emitting devices.

16 Claims, 21 Drawing Sheets

(51) Int. Cl.
*G09G 3/3266* (2016.01)
*H10K 59/121* (2023.01)
*H10K 59/123* (2023.01)
*H10K 71/00* (2023.01)
*H01L 27/12* (2006.01)
*H10K 59/12* (2023.01)

(52) U.S. Cl.
CPC ......... *H10K 59/121* (2023.02); *H10K 59/123* (2023.02); *H10K 59/1315* (2023.02); *H10K 71/00* (2023.02); *G09G 2300/0439* (2013.01); *G09G 2300/0804* (2013.01); *G09G 2310/0202* (2013.01); *G09G 2310/0281* (2013.01); *G09G 2310/08* (2013.01); *G09G 2320/0233* (2013.01); *H01L 27/124* (2013.01); *H10K 59/1201* (2023.02); *H10K 59/1213* (2023.02)

(58) Field of Classification Search
USPC .......................................................... 257/40
See application file for complete search history.

(56) References Cited

U.S. PATENT DOCUMENTS

| | | |
|---|---|---|
| 2020/0176539 A1 | 6/2020 | Sung et al. |
| 2020/0211443 A1 | 7/2020 | Zeng et al. |
| 2020/0411623 A1 | 12/2020 | Cui et al. |
| 2021/0043135 A1 | 2/2021 | Zhao et al. |
| 2021/0158750 A1 | 5/2021 | Xiang et al. |
| 2021/0225269 A1 | 7/2021 | Yang et al. |
| 2021/0351227 A1 | 11/2021 | Lius et al. |
| 2021/0408191 A1 | 12/2021 | Zhao et al. |
| 2022/0068211 A1 | 3/2022 | Jeong et al. |
| 2022/0148500 A1 | 5/2022 | Hsieh et al. |

FOREIGN PATENT DOCUMENTS

| | | | | |
|---|---|---|---|---|
| CN | 110232892 A | | 9/2019 | |
| CN | 110297365 A | | 10/2019 | |
| CN | 110491918 A | | 11/2019 | |
| CN | 110690261 A | | 1/2020 | |
| CN | 110767157 A | | 2/2020 | |
| CN | 111063719 A | * | 4/2020 | ......... H01L 27/3251 |
| CN | 111063719 A | | 4/2020 | |
| CN | 111063720 A | | 4/2020 | |
| CN | 111179831 A | | 5/2020 | |
| CN | 111192902 A | | 5/2020 | |
| CN | 111293235 A | | 6/2020 | |
| CN | 111370441 A | | 7/2020 | |
| CN | 111508377 A | | 8/2020 | |

OTHER PUBLICATIONS

Final OA issued in U.S. Appl. No. 17/426,122 dated Jul. 7, 2023.
OA issued in Chinese application No. 202080002091.6 issued Aug. 26, 2023.
OA issued in U.S. Appl. No. 17/426,122 dated Oct. 31, 2023.
OA issued in U.S. Appl. No. 17/426,122 dated Jan. 5, 2023.
OA issued in U.S. Appl. No. 17/426,122 dated Feb. 9, 2024.

* cited by examiner

Fig. 7

DISPLAY SUBSTRATE OF EVEN-DISTRIBUTED LIGHT EMITTING DEVICES, DISPLAY PANEL AND DISPLAY DEVICE

CROSS REFERENCE TO RELATED APPLICATIONS

The present disclosure is a National Stage of International Application No. PCT/CN2020/119159, filed Sep. 30, 2020, which claims priority to PCT Patent Application No. PCT/CN2020/117373, filed to the Chinese Patent Office on Sep. 24, 2020, and entitled 'DISPLAY PANEL, DISPLAY DEVICE AND PREPARATION METHOD', some or all contents of which are incorporated herein by reference.

FIELD

The present disclosure relates to the technical field of display, in particular to a display substrate, a display panel and a display device.

BACKGROUND

With the rapid development of smart phones, not only is the appearance of mobile phones required to be beautiful, but also a better visual experience for mobile phone users is also required. Major manufacturers have begun to increase the screen-to-body ratio on smart phones, making full screens a new competitive point for smart phones. With the development of the full screens, the demand for performance and function improvement is also increasing. Under the premise of not affecting the high screen-to-body ratio, offscreen cameras can bring a sense of impact in the visual and use experience to a certain extent.

SUMMARY

In one aspect, the embodiments of the present disclosure provide a display substrate, including:
  a substrate, wherein a display region of the substrate includes a first display region and a second display region at least located on one side of the first display region, and a light transmittance of the first display region is larger than that of the second display region;
  a drive circuit layer located on the substrate and including: a plurality of first pixel circuits located in a bezel region around the display region and a plurality of second pixel circuits located in the second display region; and
  a light emitting device layer located on one side, deviating from the substrate, of the drive circuit layer, wherein the light emitting device layer includes a plurality of first light emitting devices located in the first display region and a plurality of second light emitting devices located in the second display region; each of the plurality of first light emitting devices is correspondingly and electrically connected with each of the plurality of first pixel circuits; each of the plurality of second light emitting devices is correspondingly and electrically connected with each of the plurality of second pixel circuits; and a density of the plurality of first light emitting devices in the first display region is the same as a density of the plurality of second light emitting devices in the second display region.

Optionally, in the above-described display substrate provided by embodiments of the present disclosure, the plurality of first pixel circuits are located in the bezel region adjacent to the plurality of first light emitting devices.

Optionally, in the above-described display substrate provided by embodiments of the present disclosure, at least part of columns in which the plurality of first pixel circuits are located are in one-to-one correspondence with at least part of columns in which the plurality of second pixel circuits are located.

Optionally, in the above-described display substrate provided by embodiments of the present disclosure, the drive circuit layer includes: a plurality of first data lines and a plurality of second data lines, wherein
  in a column direction, at least part of each of the first data lines overlaps with the first display region, and each of the first data lines is correspondingly and electrically connected with at least one column of the first pixel circuits; and
  in a column direction, at least part of each of the second data lines overlaps with the second display region, and each of the second data lined is correspondingly and electrically connected with one column of the second pixel circuits.

Optionally, in the above-described display substrate provided by embodiments of the present disclosure, the drive circuit layer includes: a plurality of second data lines, wherein in a column direction, at least part of each of the second data lines overlaps with the second display region, and each of the second data lines is correspondingly and electrically connected with at least one column of the first pixel circuits and one column of the second pixel circuits.

Optionally, in the above-described display substrate provided by embodiments of the present disclosure, the drive circuit layer includes: a plurality of first data lines and a plurality of second data lines, wherein
  in the column direction, at least part of each of the first data lines overlaps with the first display region, and each of the first data lines is electrically connected with at least one column in which the first pixel circuits are located in a one-to-one correspondence mode; and
  in the column direction, at least part of each of the second data lines overlaps with the second display region, the plurality of second data lines are electrically connected with the columns in which the plurality of second pixel circuits are located in a one-to-one correspondence mode, and the columns in which the first pixel circuits which are not electrically connected with the first data lines are located are electrically connected with the second data lines of the corresponding columns in which the second pixel circuits are located.

Optionally, in the above-described display substrate provided by embodiments of the present disclosure, the plurality of first data lines are bent along an edge of the first display region toward a side, deviating from or close to the second display region, of the first pixel circuits; or, the plurality of first data lines are bent along an edge of the first display region toward a side, deviating from or close to the first display region, of the first pixel circuits.

Optionally, in the above-described display substrate provided by embodiments of the present disclosure, one second data line connecting the column of the first pixel circuits and the corresponding column of the second pixel circuits is a straight line extending in the column direction, in response to that one column of the first pixel circuits and one corresponding column of the second pixel circuits are disposed opposite to each other in the column direction; or,
  the second data lines connecting the column of the first pixel circuits and the corresponding column of the second pixel circuits include oblique lines, in response to that one column of the first pixel circuits and one corresponding column of the second pixel circuits are staggered in the column direction of the second display region; or, the second data lines connecting the column of the first pixel circuits and the corresponding column of the second pixel circuits include broken lines, in response to that one column of the first pixel circuits in the column direction of the first display region and one column of the second pixel circuits in the second display region are correspondingly disposed.

Optionally, in the above-described display substrate provided by embodiments of the present disclosure, the drive circuit layer includes: a plurality of first shift register units disposed in cascade in the bezel region, a plurality of second shift register units disposed in cascade, a plurality of first control lines extending in a row direction and a plurality of second control lines extending in a row direction in the second display region, wherein each of the first shift register units is electrically connected with one row of the first pixel circuits through one first control line; and each of the second shift register units is electrically connected with one row of the second pixel circuits through one second control line.

Optionally, in the above-described display substrate provided by embodiments of the present disclosure, the first light emitting devices include first anodes, and the second light emitting devices include second anodes, wherein an orthographic projection area of the first anodes on the substrate is smaller than that of the second anodes, in response to that the light emitting color of the first light emitting devices is the same as that of the second light emitting devices.

Optionally, in the above-described display substrate provided by embodiments of the present disclosure, a ratio of the orthographic projection area of the first anodes on the substrate to the orthographic projection area of the second anodes corresponding to at least one same color as the first anodes is greater than or equal to 3/10 and less than or equal to 9/10.

Optionally, in the above-described display substrate provided by embodiments of the present disclosure, the display substrate further includes: a plurality of transparent conductive layers stacked between the drive circuit layer and the light emitting device layer and insulated from each other, each transparent conductive layer includes a plurality of transparent wirings, and each transparent wiring is connected between the corresponding first pixel circuit and the corresponding first light emitting device in a one-to-one correspondence mode.

Optionally, in the above-described display substrate provided by embodiments of the present disclosure, the plurality of transparent wirings included in each transparent conductive layer do not overlap with each other, and orthographic projections of the plurality of transparent wirings included in different transparent conductive layers on the substrate do not overlap with each other or at least partially overlap with each other.

Optionally, in the above-described display substrate provided by embodiments of the present disclosure, the plurality of transparent conductive layers include a first transparent conductive layer, a second transparent conductive layer and a third transparent conductive layer which are stacked and insulated from each other, wherein the first transparent conductive layer includes a plurality of first transparent wirings, the second transparent conductive layer includes a plurality of second transparent wirings, and the third transparent conductive layer includes a plurality of third transparent wirings;

the plurality of first light emitting devices include a plurality of first color light emitting devices, a plurality of second color light emitting devices and a plurality of third color light emitting devices;

the first pixel circuits include first sub-pixel circuits, second sub-pixel circuits and third sub-pixel circuits;

one end of the first transparent wirings are electrically connected with the first sub-pixel circuits, and the other end of the first transparent wirings are correspondingly and electrically connected with the first color light emitting devices;

one end of the second transparent wirings are electrically connected with the second sub-pixel circuits, and the other end of the second transparent wirings are correspondingly and electrically connected with the second color light emitting devices; and one end of the third transparent wirings are electrically connected with the third sub-pixel circuits, and the other end of the third transparent wirings are correspondingly and electrically connected with the third color light emitting devices.

Optionally, in the above-described display substrate provided by embodiments of the present disclosure, the first display region is configured to mount a light extraction module.

In another aspect, some embodiments of the present disclosure also provide a display panel including the display substrate.

In another aspect, some embodiments of the present disclosure also provide a display device, including: a light extraction module and the display panel, wherein the light extraction module is disposed in the first display region of the display panel.

BRIEF DESCRIPTION OF THE DRAWINGS

Figure 7:
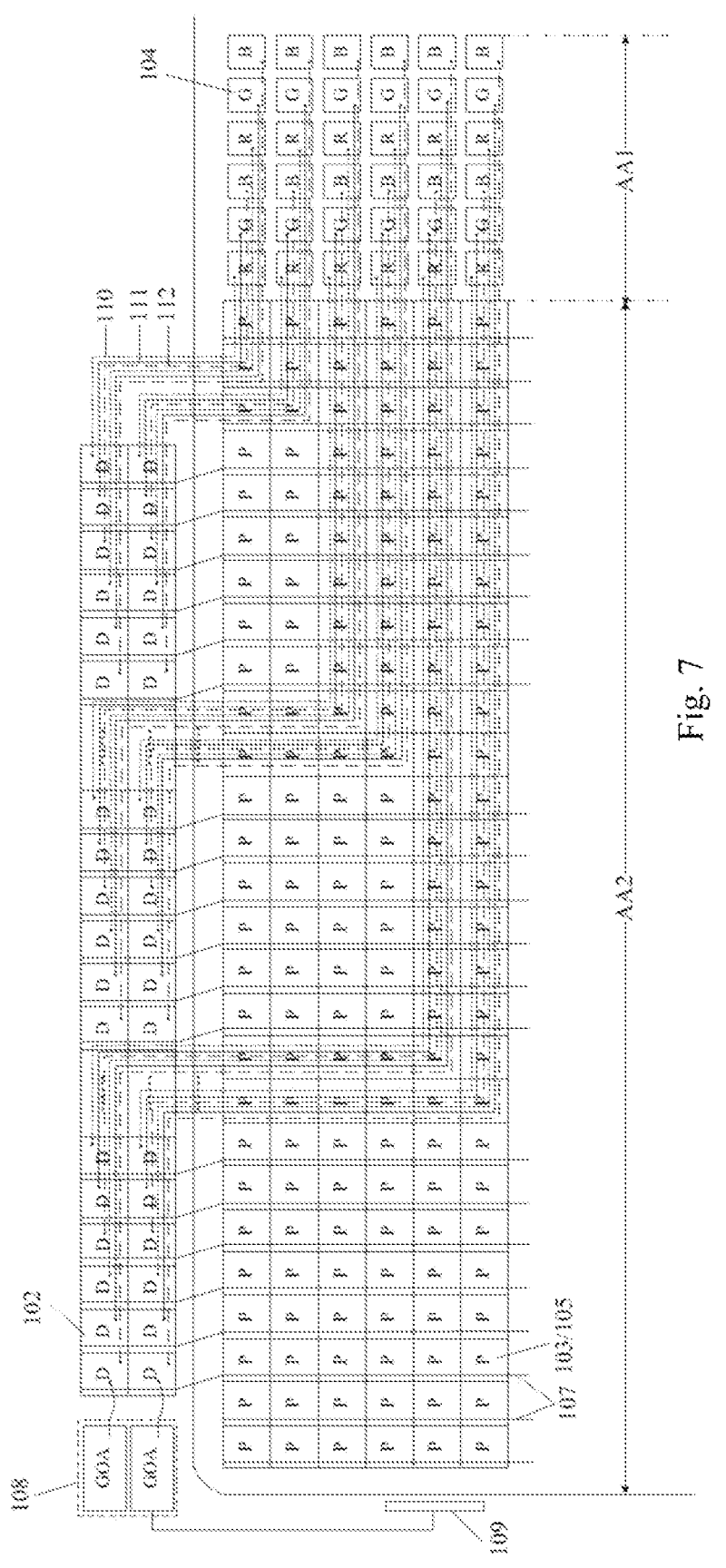

FIG. 7 is another enlarged structural schematic diagram of a region d in FIG. 3.

DETAILED DESCRIPTION OF THE EMBODIMENTS

Figure 1:
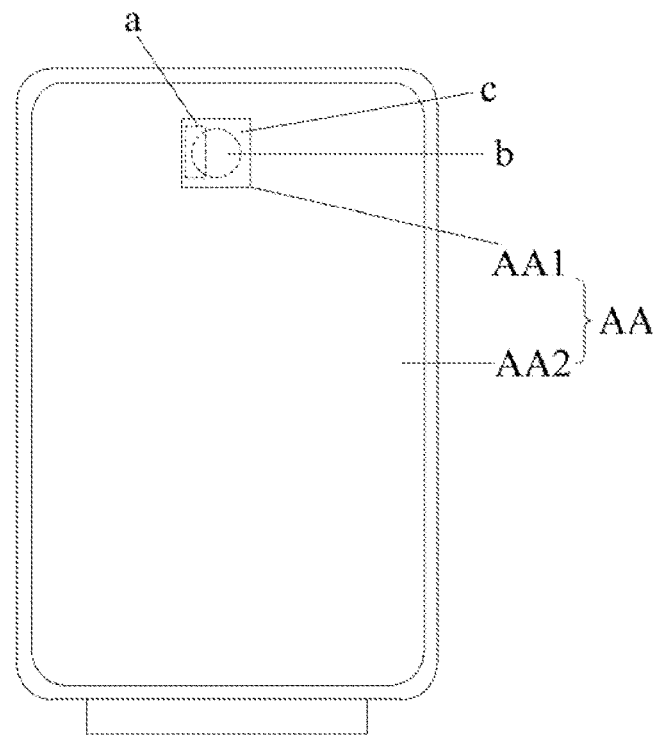
FIG. 1 is a structural schematic diagram of a display substrate in the related art.

In order to make the objective, technical solutions and advantages of the embodiments of the present disclosure more clear, the technical solutions of the embodiments of the present disclosure will be clearly and fully described in combination with the accompanying drawings of the embodiments of the present disclosure. It should be noted that the dimensions and shapes of the various figures in the accompanying drawings do not reflect the true scale and are intended to be merely illustrative of the present disclosure. Meanwhile, the same or similar reference numerals refer to the same or similar elements or elements having the same or similar functions throughout. Obviously, the described embodiments are some, but not all, embodiments of the present disclosure. Based on the described embodiments of the present disclosure, all other embodiments obtained by those of ordinary skill in the art without any inventive effort are within the protection scope of the present disclosure.

Unless defined otherwise, technical or scientific terms used herein shall have the ordinary meaning as understood by those of ordinary skill in the art to which the present disclosure belongs. The terms 'first', 'second', and the like used in the description and claims of the present disclosure do not denote any order, quantity, or importance, but rather are used solely to distinguish one component from another. The word 'include' or 'comprise', and the like, means that an element or article that precedes the word is inclusive of an element or article listed after the word and equivalents thereof, but does not exclude other elements or articles. The terms 'inner', 'outer', 'upper', 'lower", and the like are used merely to denote a relative positional relationship that may change accordingly when the absolute position of an object being described changes.

In the related art, as shown in FIG. 1, an offscreen camera technology generally provides a first display region AA1 and a second display region AA2 in a display region AA, wherein the first display region AA1 is located above a front camera. Optionally, the first display region AA1 includes a region b where the camera is located and a region c without the camera, wherein two circuits exist in the region c without the camera, one is a normal pixel P containing pixel circuits D and light emitting devices A and the other is a Dummy pixel only containing pixel circuits D; and only light emitting devices A are disposed in the region b where the camera is located, and a signal for driving the light emitting devices A is led out by the Dummy pixel. However, since it is necessary to ensure that the region b where the camera is located has a sufficient light transmittance, part of the light emitting devices A in the region b where the camera is located need to be dug out, and a resolution ratio (PPI) of the first display region AA1 is lower than that of the second display region AA2, which affects the overall display effect.

Figure 3:
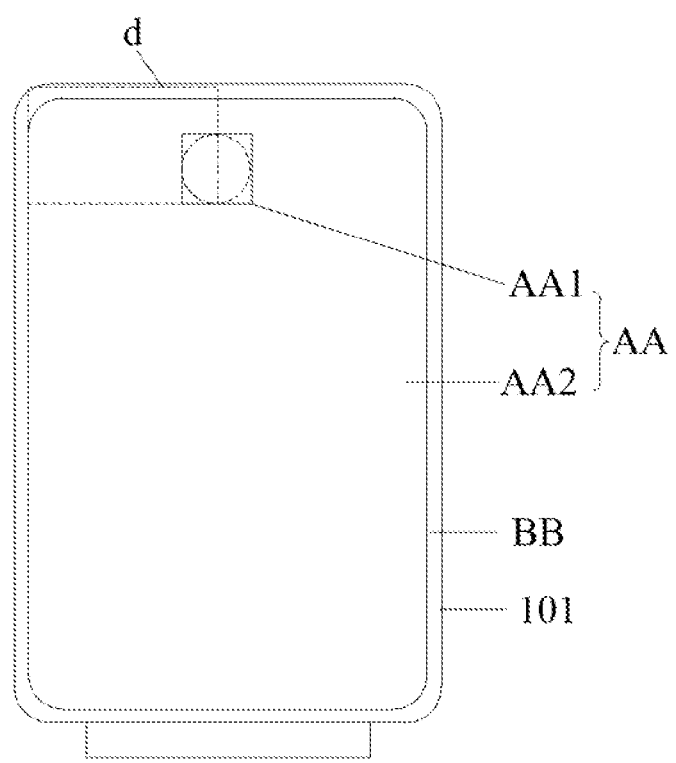
FIG. 3 is a structural schematic diagram of a display substrate provided by embodiments of the present disclosure.
Figure 4:
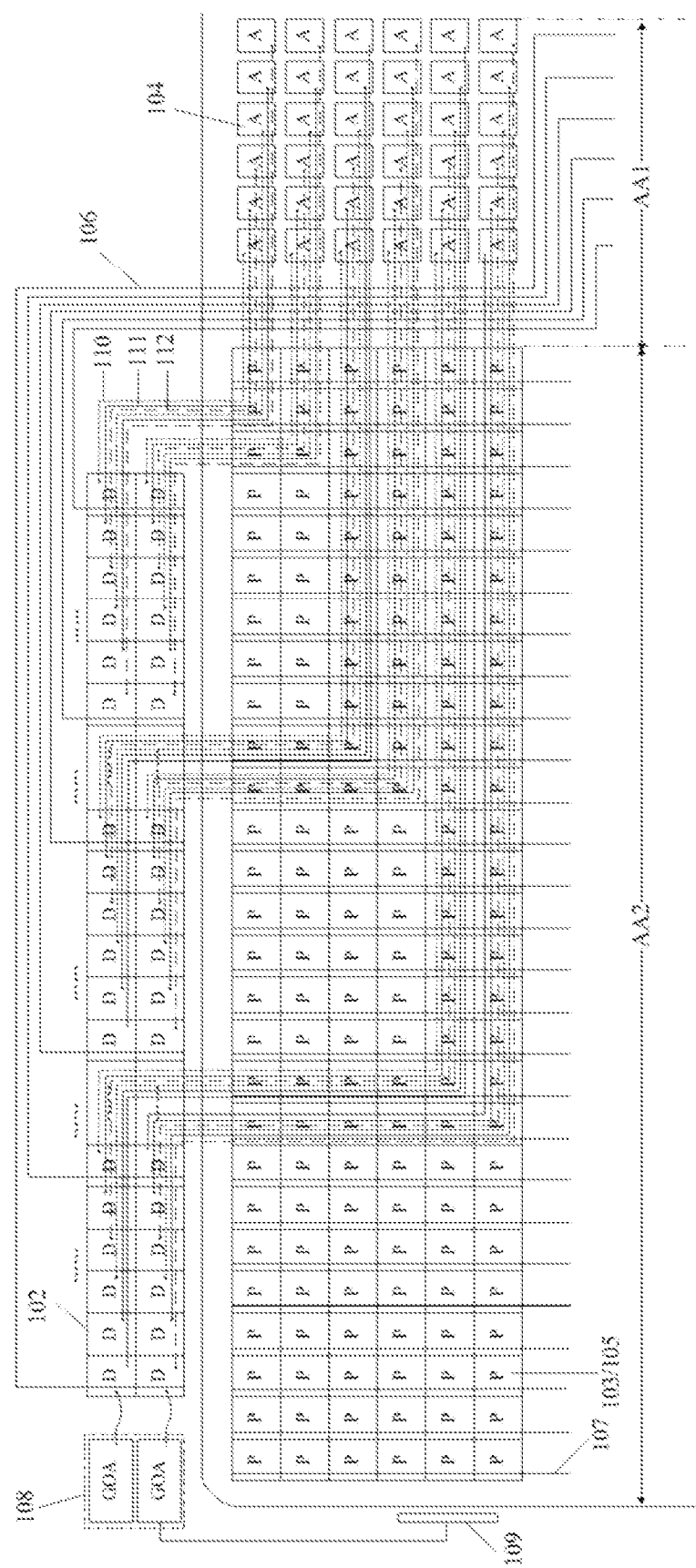
FIG. 4 is an enlarged structural schematic diagram of a region d in FIG. 3.

Aiming at the technical problems existing in the related art, some embodiments of the present disclosure provide a display substrate, as shown in FIGS. 3 and 4, including:

a substrate 101, wherein a display region AA of the substrate 101 includes a first display region AA1 and a second display region AA2 at least located on one side of the first display region AA1, and a light transmittance of the first display region AA1 is larger than that of the second display region AA2;

a drive circuit layer located on the substrate 101 and including: a plurality of first pixel circuits 102 located in a bezel region BB around the display region and a plurality of second pixel circuits 103 located in the second display region AA2; and a light emitting device layer located on one side, deviating from the base substrate 101, of the drive circuit layer, wherein the light emitting device layer includes a plurality of first light emitting devices 104 located in the first display region AA1 and a plurality of second light emitting devices 105 located in the second display region AA2; each of the plurality of first light emitting devices 104 is correspondingly and electrically connected with each of the plurality of first pixel circuits 102; each of the plurality of second light emitting devices 105 is correspondingly and electrically connected with each of the plurality of second pixel circuits 103; and a density (namely a resolution ratio) of the plurality of first light emitting devices 104 in the first display region AA1 is the same as a density of the plurality of second light emitting devices 105 in the second display region AA2.

In the above-described display substrate provided by embodiments of the present disclosure, only the first light emitting devices 104 exist in the first display region AA1 with a higher light transmittance, a driving signal of the first light emitting devices 104 may be provided by the first pixel circuits 102 in the bezel region BB, and the density of the first light emitting devices 104 in the first display region AA1 is the same as that of the second light emitting devices 105 in the second display region AA2, so that adverse effects caused by different resolution ratios of the first display region AA1 and the second display region AA2 are avoided, and the overall display effect is improved.

It should be noted that the shape of the first display region AA1 in the present disclosure may be a square as shown in FIG. 3, or other shapes such as a circle, which may be specifically designed according to practical requirements, and is not limited thereto. The second display region AA2 may surround the periphery of the first display region AA1 as shown in FIG. 3, and may also surround part of the first display region AA1, for example the left side, the lower side and the right side of the first display region AA1, and an upper boundary of the first display region AA1 coincides with an upper boundary of the second display region AA2. In addition, in the present disclosure, the first light emitting devices 104 and the second light emitting devices 105 refer to pixels actually used to display light emission, excluding dummy pixels, and the dummy pixels are pixels which are not used to emit light because they are not connected to signal lines, although they have a stacked structure of an anode, a light emitting layer (EL) and a cathode. Also, the first pixel circuits 102 and the second pixel circuits 103 are circuits configured to connect light emitting pixels.

Optionally, in the above-described display substrate provided by embodiments of the present disclosure, as shown in FIGS. 3 and 4, the plurality of first pixel circuits 102 are located in the bezel region BB adjacent to the plurality of first light emitting devices 104, and FIGS. 3 and 4 show the plurality of first pixel circuits 102 being located in an upper bezel region.

By arranging the plurality of first pixel circuits 102 in the bezel region BB which are adjacent to the plurality of first light emitting devices 104 and the plurality of second light emitting devices 105 together, the length of transparent wirings between the first pixel circuits 102 and the first light emitting devices 104 can be effectively reduced, the resistance of the transparent wirings is further reduced, and the long-range uniformity of the driving signal is improved.

Optionally, in the above-described display substrate provided by embodiments of the present disclosure, in order to further reduce the length of the transparent wirings between the first pixel circuits 102 and the first light emitting devices 104 and reduce the resistance of the transparent wirings, as shown in FIGS. 4 to 21, at least part of columns in which the plurality of first pixel circuits 102 are located may be in one-to-one correspondence with at least part of columns in which the plurality of second pixel circuits 103 are located. Optionally, FIGS. 4 to 7 and FIGS. 12 to 15 show that the columns in which the plurality of first pixel circuits 102 are located are in one-to-one correspondence with part of columns in which the plurality of second pixel circuits 103 on the left side of the first display region AA1 are located; and FIGS. 8 to 11 and FIGS. 16 to 21 show that the columns in which the plurality of first pixel circuits 102 are located are in one-to-one correspondence with the columns of the plurality of second pixel circuits 103 on the left side and the lower side of the first display region AA1. Of course, in the specific implementation, if the number of the first light emitting devices 104 is large, accordingly, the number of the first pixel circuits 102 electrically connected to the first light emitting devices 104 in a one-to-one correspondence mode is large, at the moment, the columns in which the plurality of first pixel circuits 102 are located are in one-to-one correspondence with all the columns in which the plurality of second pixel circuits 103 are located, and in the case that the space of the bezel region BB allows, not only may two rows of first pixel circuits 102 be provided, but also two or more rows of first pixel circuits 102 may be provided.

Optionally, in the above-described display substrate provided by embodiments of the present disclosure, the first pixel circuits 102 may be loaded with a data signal in three ways.

Figure 5:
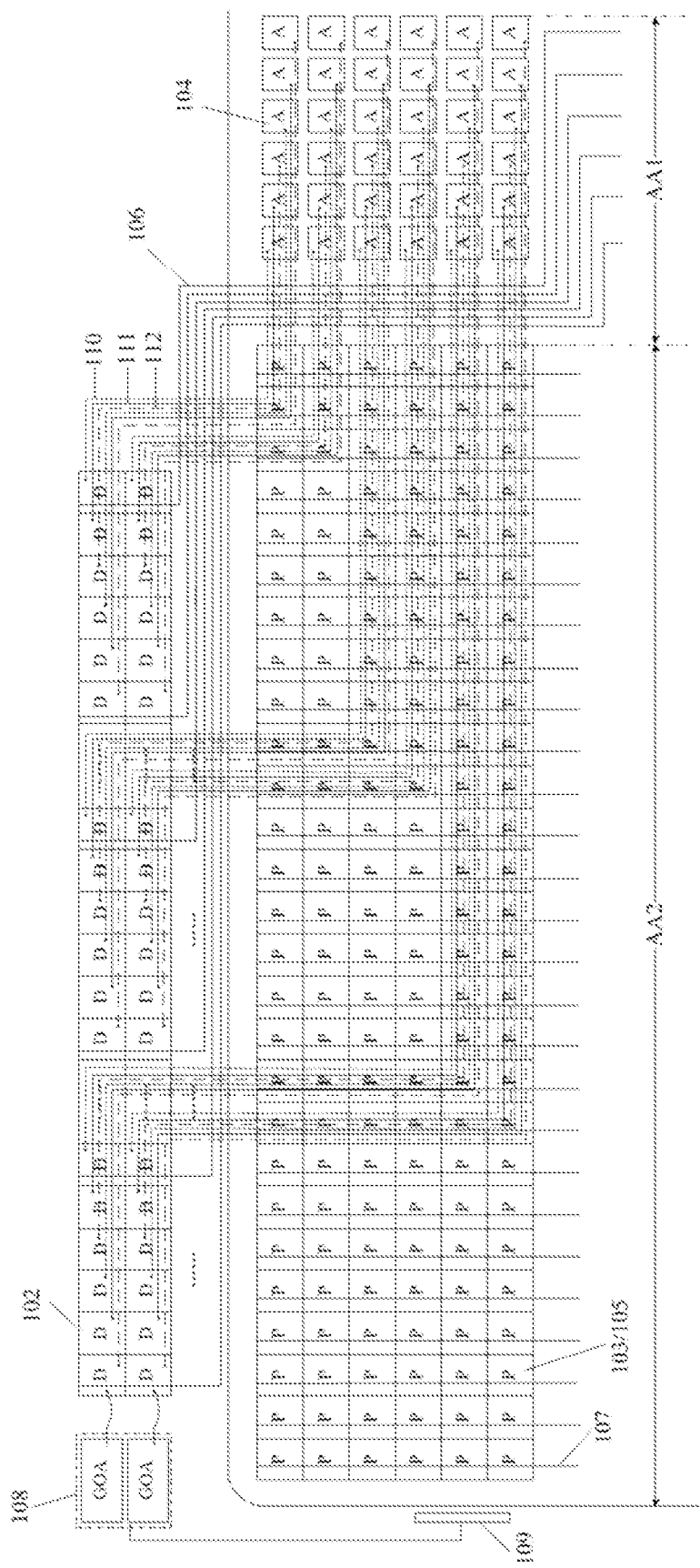
FIG. 5 is another enlarged structural schematic diagram of a region d in FIG. 3.
Figure 6:
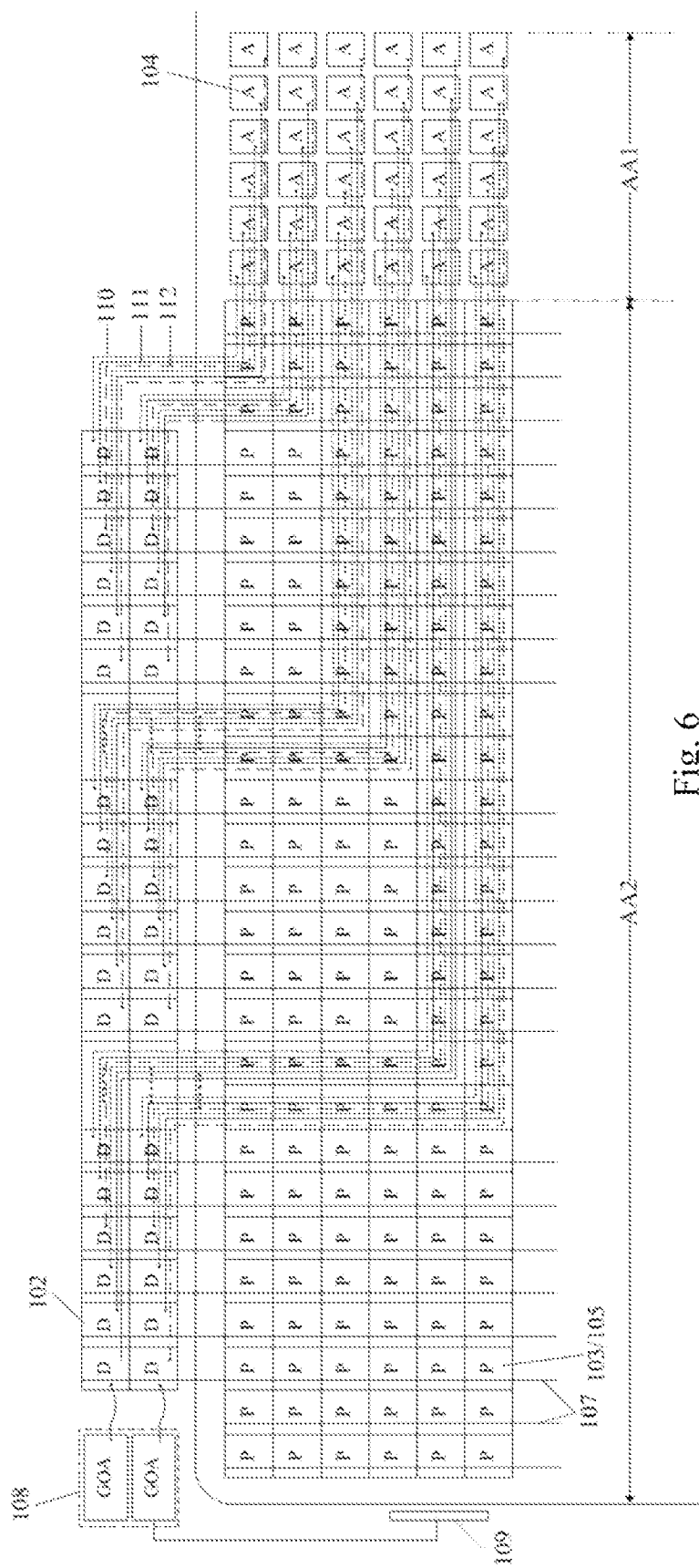
FIG. 6 is another enlarged structural schematic diagram of a region d in FIG. 3.
Figure 8:
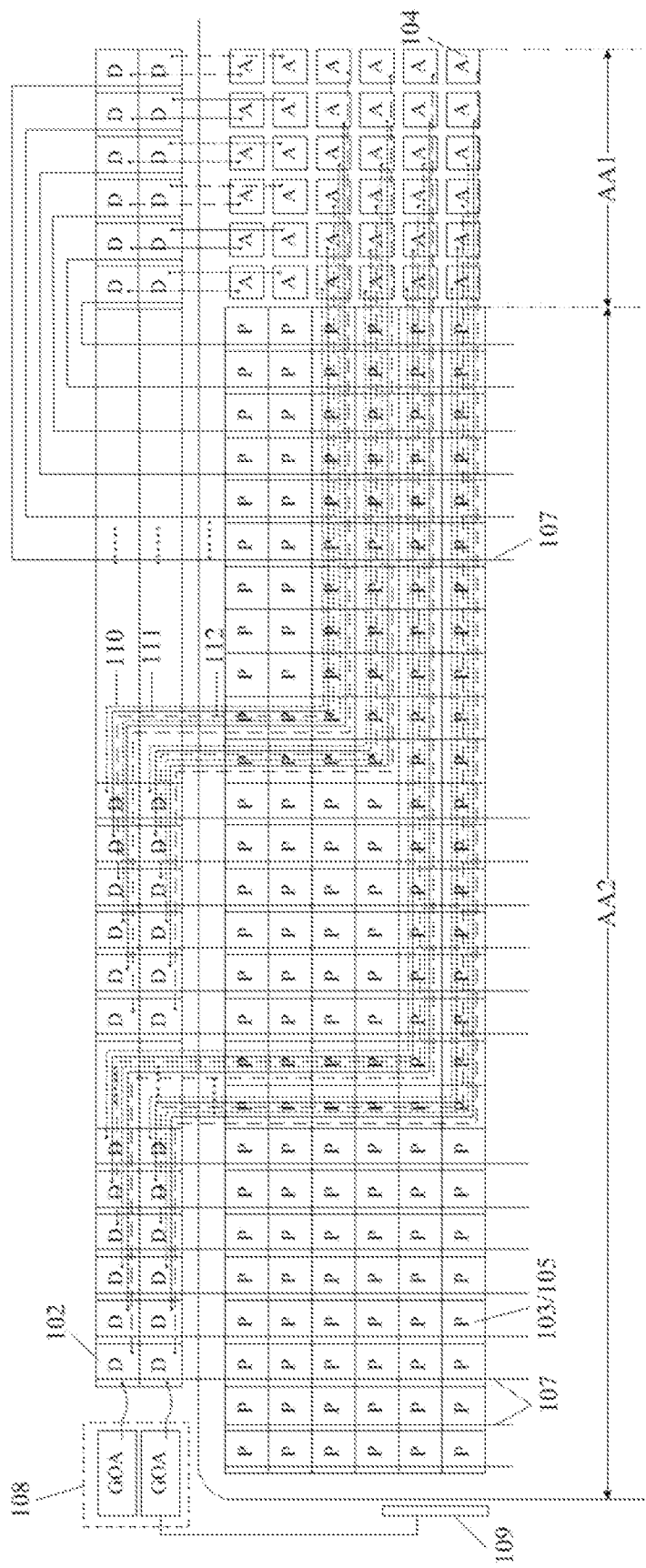
FIG. 8 is another enlarged structural schematic diagram of a region d in FIG. 3.
Figure 9:
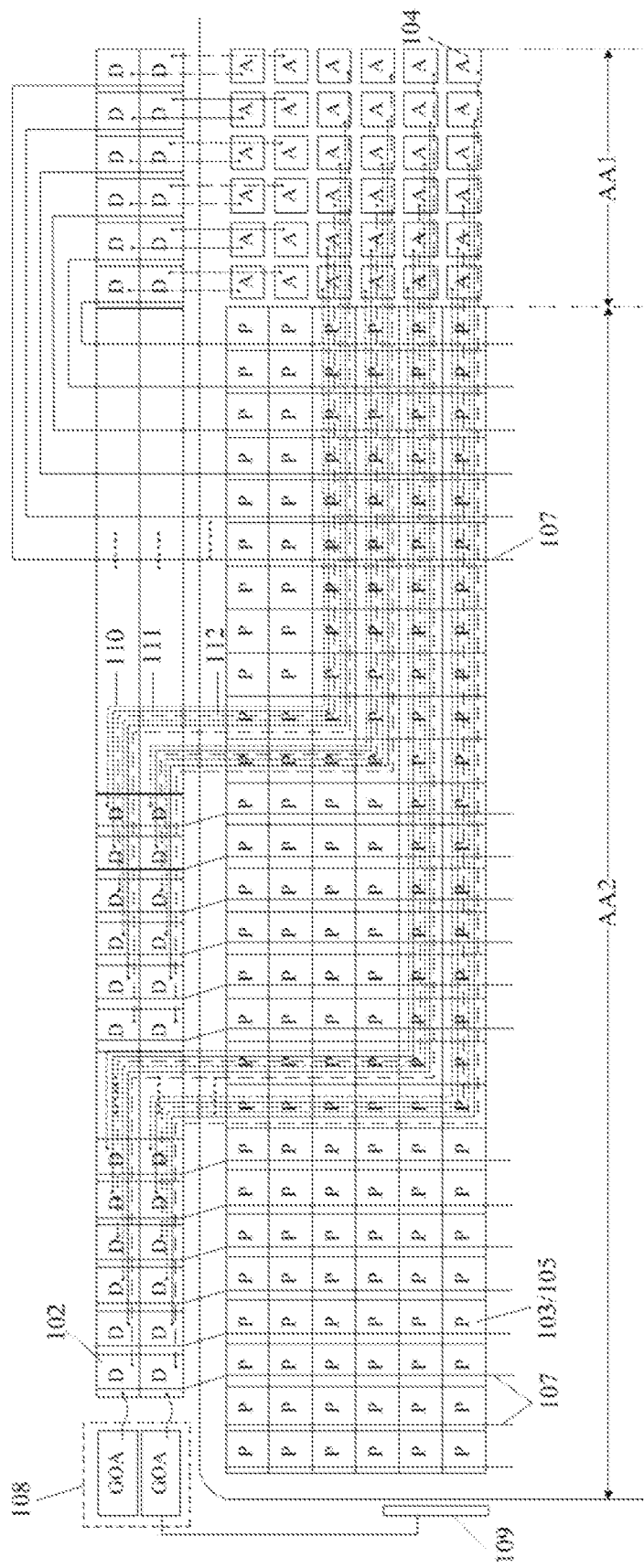
FIG. 9 is another enlarged structural schematic diagram of a region d in FIG. 3.
Figure 10:
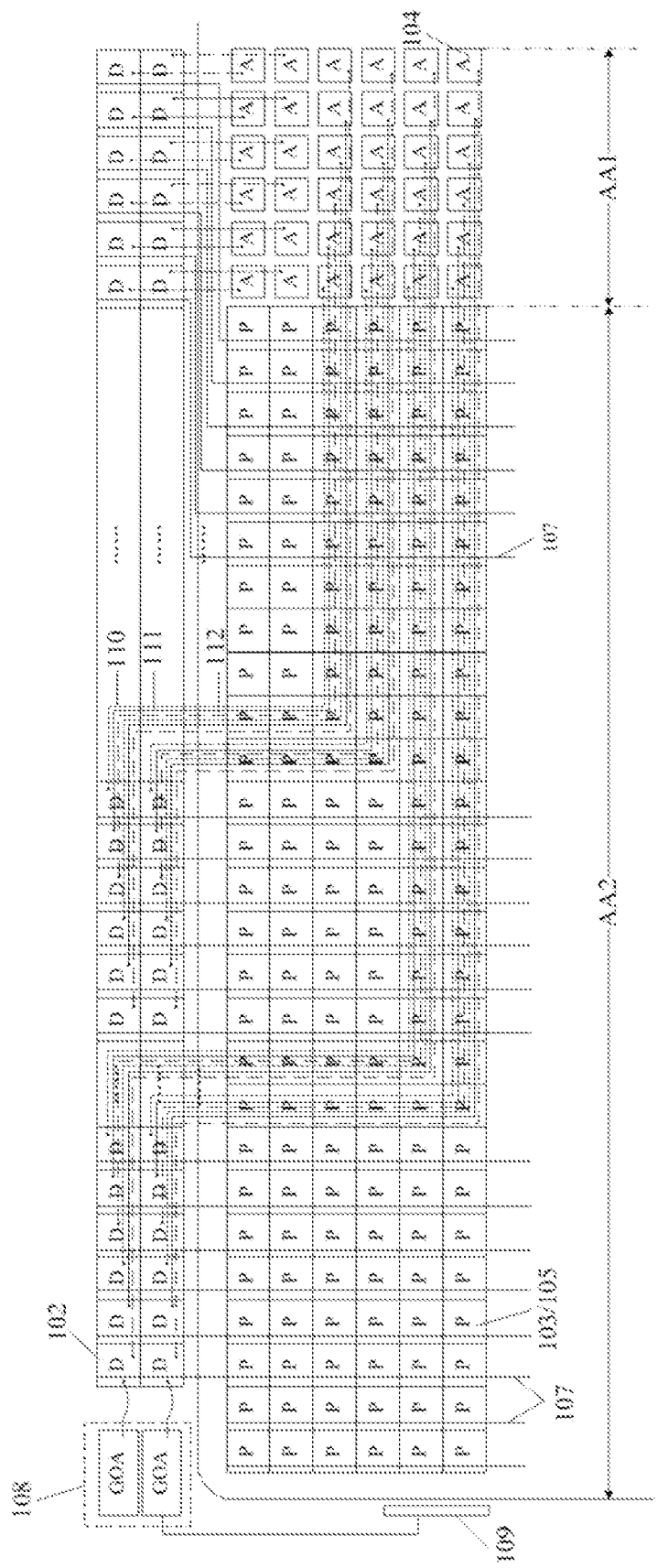
FIG. 10 is another enlarged structural schematic diagram of a region d in FIG. 3.
Figure 11:
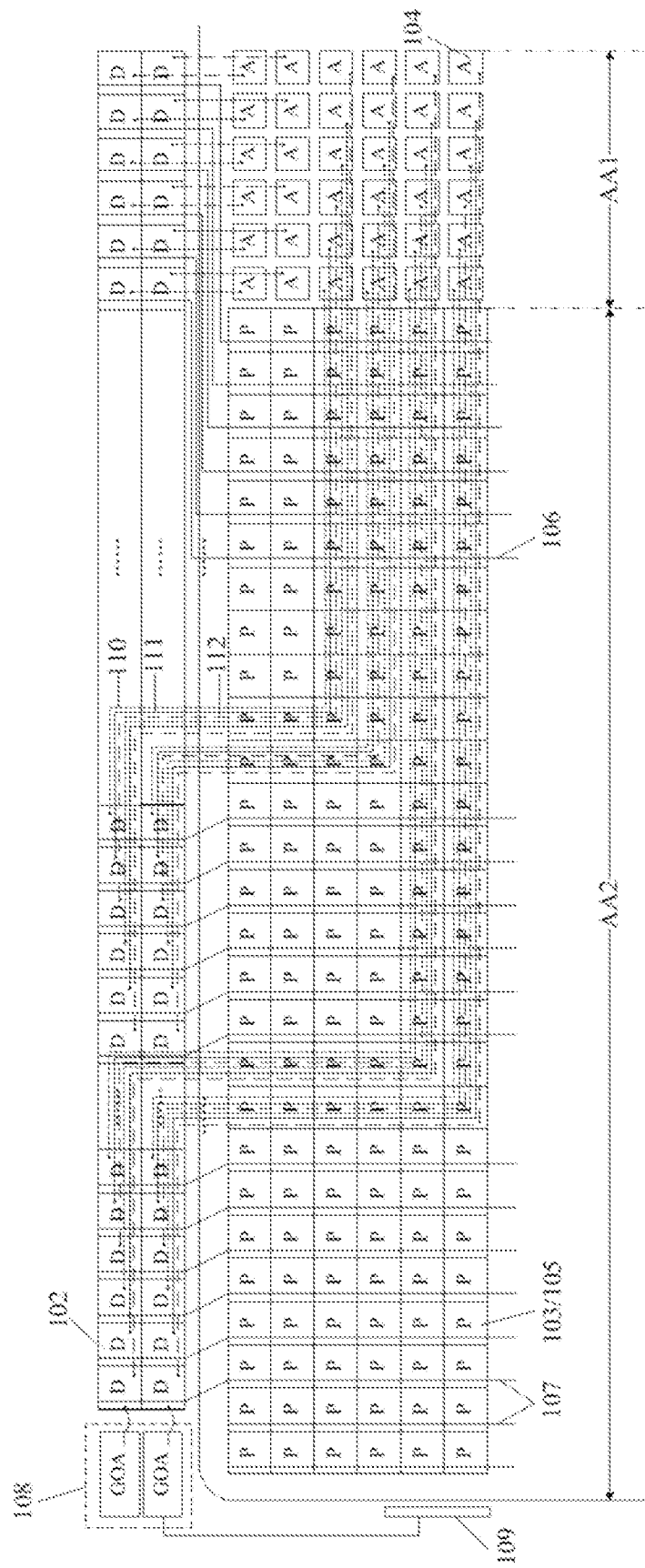
FIG. 11 is another enlarged structural schematic diagram of a region din FIG. 3.

A first possible implementation is shown in FIGS. 4 and 5, and the drive circuit layer includes: a plurality of first data lines 106 and a plurality of second data lines 107, wherein in the column direction, at least part of each first data line 106 overlaps with the first display region AA1, and each first data line 106 is correspondingly and electrically connected with one column of the first pixel circuits 102; and in the column direction, at least part of each second data line 107 overlaps with the second display region AA2, and each second data line 107 is correspondingly and electrically connected with one column of the second pixel circuits 103. That is, the first pixel circuits 102 are loaded with the data signal by adding the first data lines 106.

A second possible implementation is shown in FIGS. 6, 7, and 12 to 15, and the drive circuit layer includes: a plurality of second data lines 107, wherein in the column direction, at least part of each second data line 107 overlaps with the second display region AA2, and each second data line 107 is electrically connected to one column of the first pixel circuits 102 and one column of the second pixel circuits 103. That is, the data signal is introduced to the first pixel circuits 102 contained in the column directly by the second data line 107 electrically connected to the second pixel circuits 103 contained in the corresponding column.

A third possible implementation is shown in FIGS. 8 to 11 and FIGS. 16 to 20, and the drive circuit layer includes: a plurality of first data lines 106 and a plurality of second data lines 107, wherein in the column direction, at least part of each first data line 106 overlaps with the first display region AA1, and the plurality of first data lines 106 are electrically connected with part of columns in which the plurality of first pixel circuits 102 are located in a one-to-one correspondence mode; and in the column direction, at least part of each second data line 107 overlaps with the second display region AA2, the plurality of second data lines 107 are electrically connected with the columns in which the plurality of second pixel circuits 103 are located in a one-to-one correspondence mode, and the columns in which the first pixel circuits 102 which are not electrically connected with the first data lines 106 are located are electrically connected with the second data lines 107 of the corresponding columns in which the second pixel circuits 103 are located. That is, the first pixel circuits 102 adjacent to the first display region AA1 are loaded with the data signal by adding the first data lines 106, and the remaining first pixel circuits 102 are directly loaded with the data signal by the second data lines 107 electrically connected with the second pixel circuits 103 contained in the corresponding columns.

Figure 19:
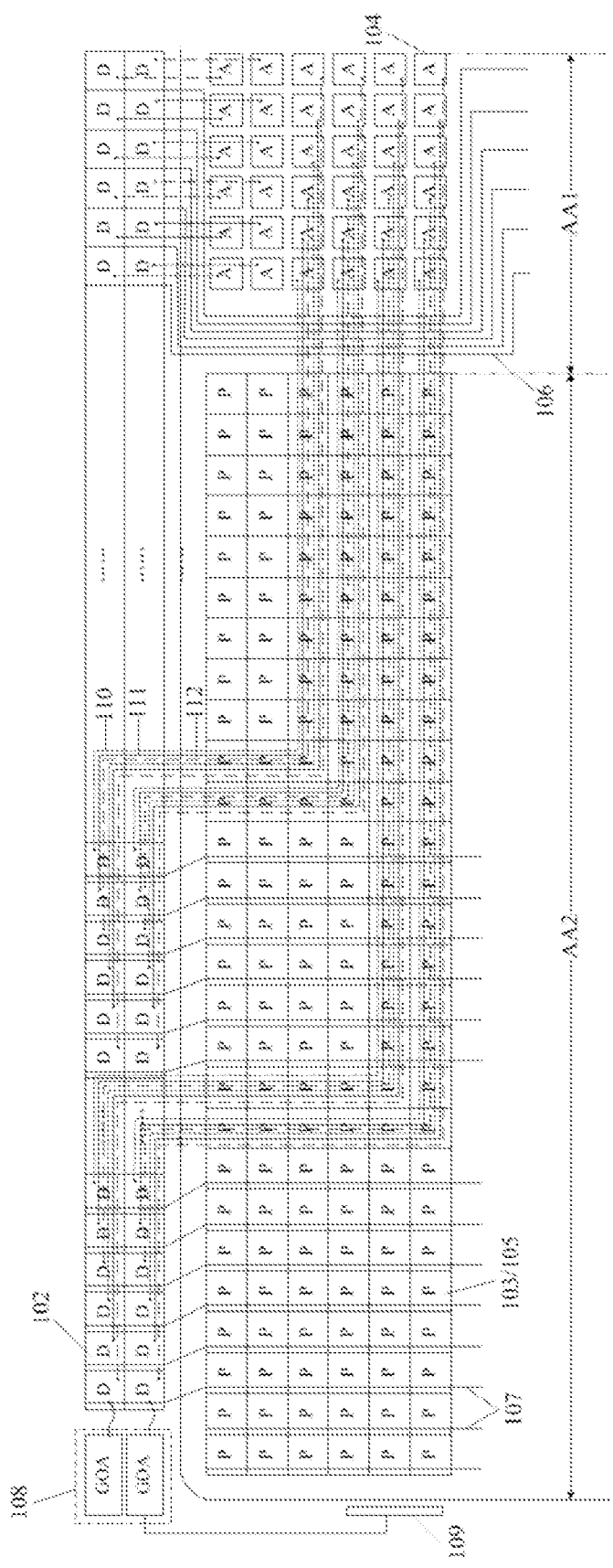
FIG. 19 is another enlarged structural schematic diagram of a region d in FIG. 3.
Figure 20:
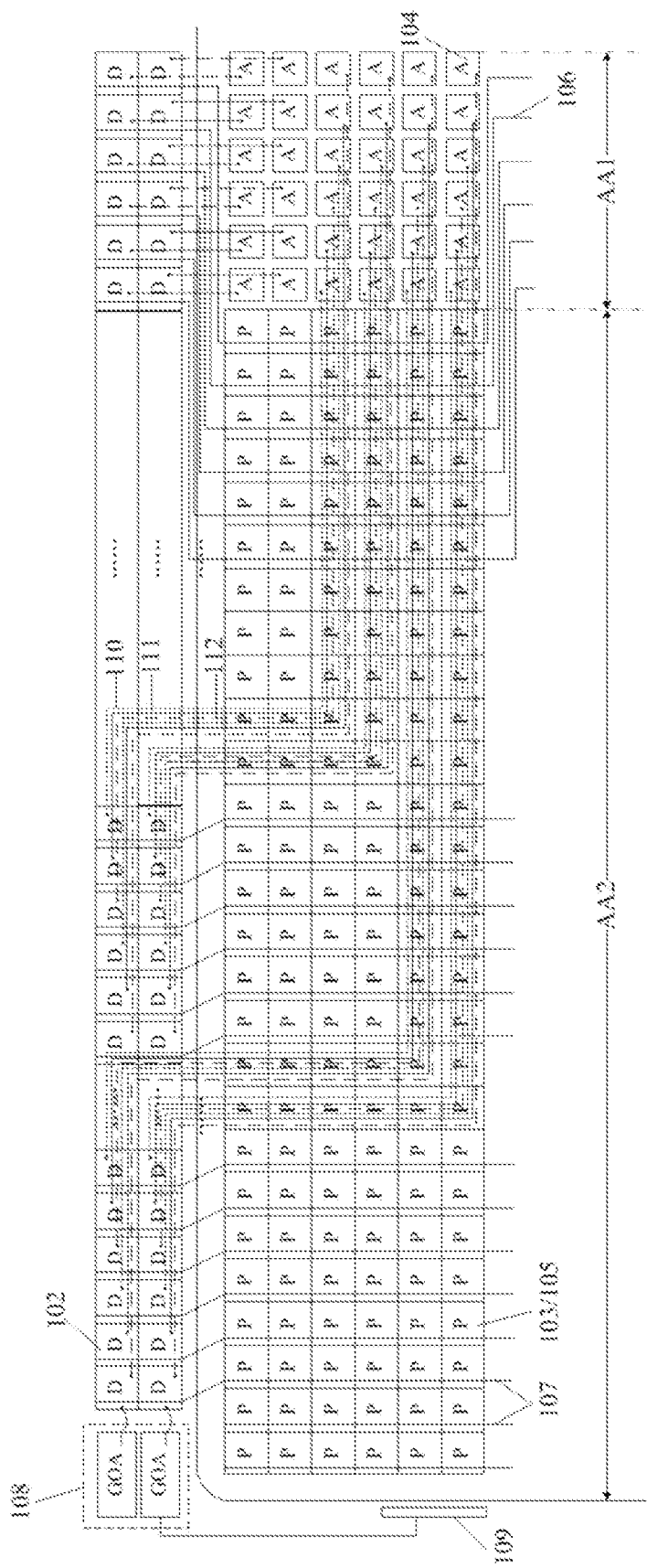
FIG. 20 is another enlarged structural schematic diagram of a region d in FIG. 3.
Figure 21:
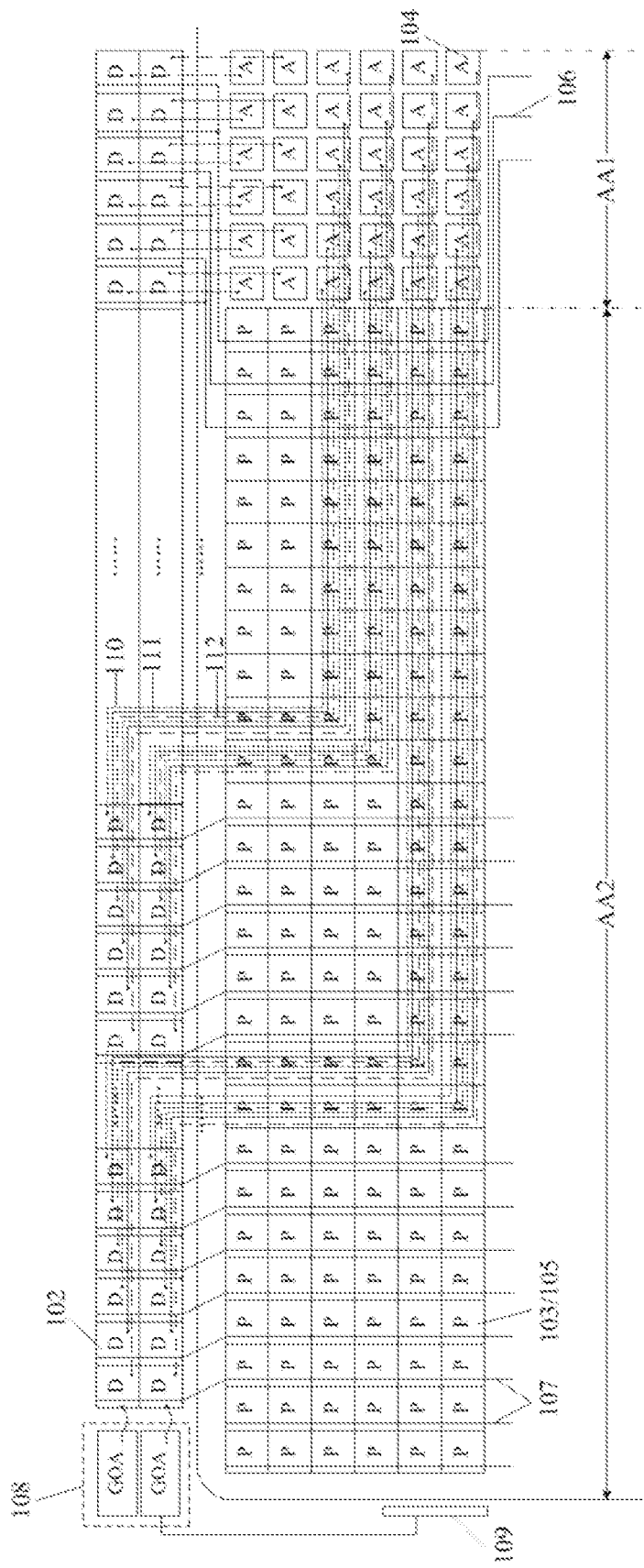
FIG. 21 is another enlarged structural schematic diagram of a region d in FIG. 3.

It should be noted that in the present disclosure, one first data line 106 may be disposed to be electrically connected with one column of first pixel circuits 102, as shown in FIGS. 4, 5, and 12 to 20; and it is also possible to dispose one first data line 106 to be electrically connected with a plurality of columns of first pixel circuits 102, optionally, FIG. 21 shows one first data line 106 is electrically connected with two columns of first pixel circuits 102. In addition, when one second data line 107 is electrically connected with the first pixel circuits 102, the second data line 107 may be electrically connected with at least one column of the first pixel circuits 102, which is not limited thereto.

Figure 12:
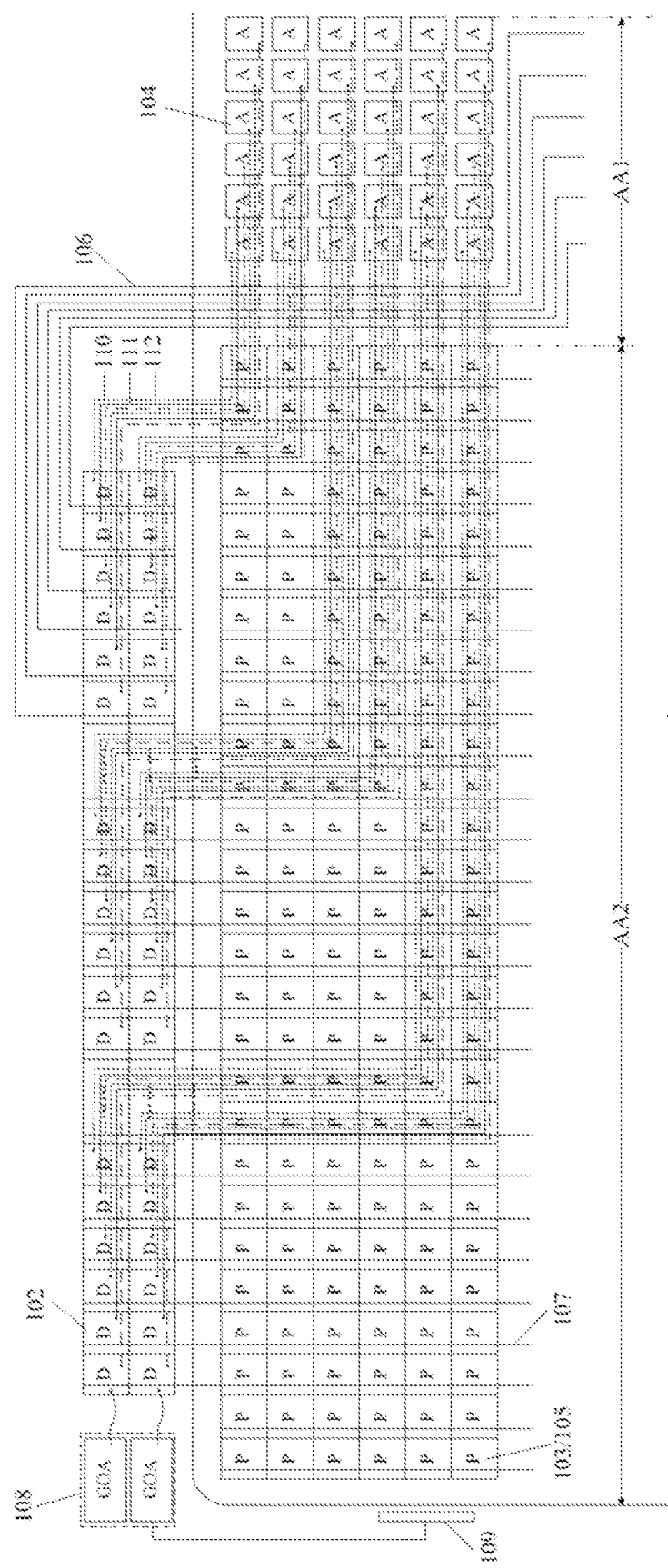
FIG. 12 is another enlarged structural schematic diagram of a region d in FIG. 3.
Figure 13:
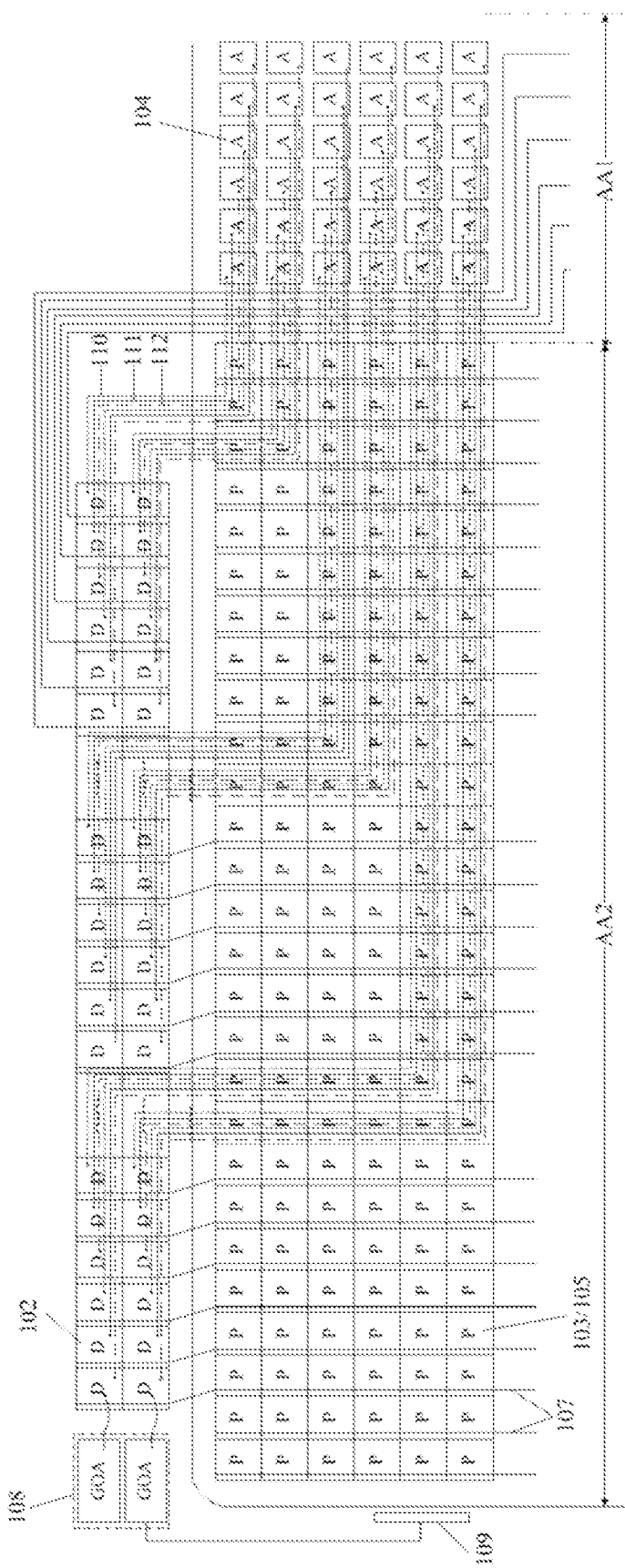
FIG. 13 is another enlarged structural schematic diagram of a region d in FIG. 3.
Figure 14:
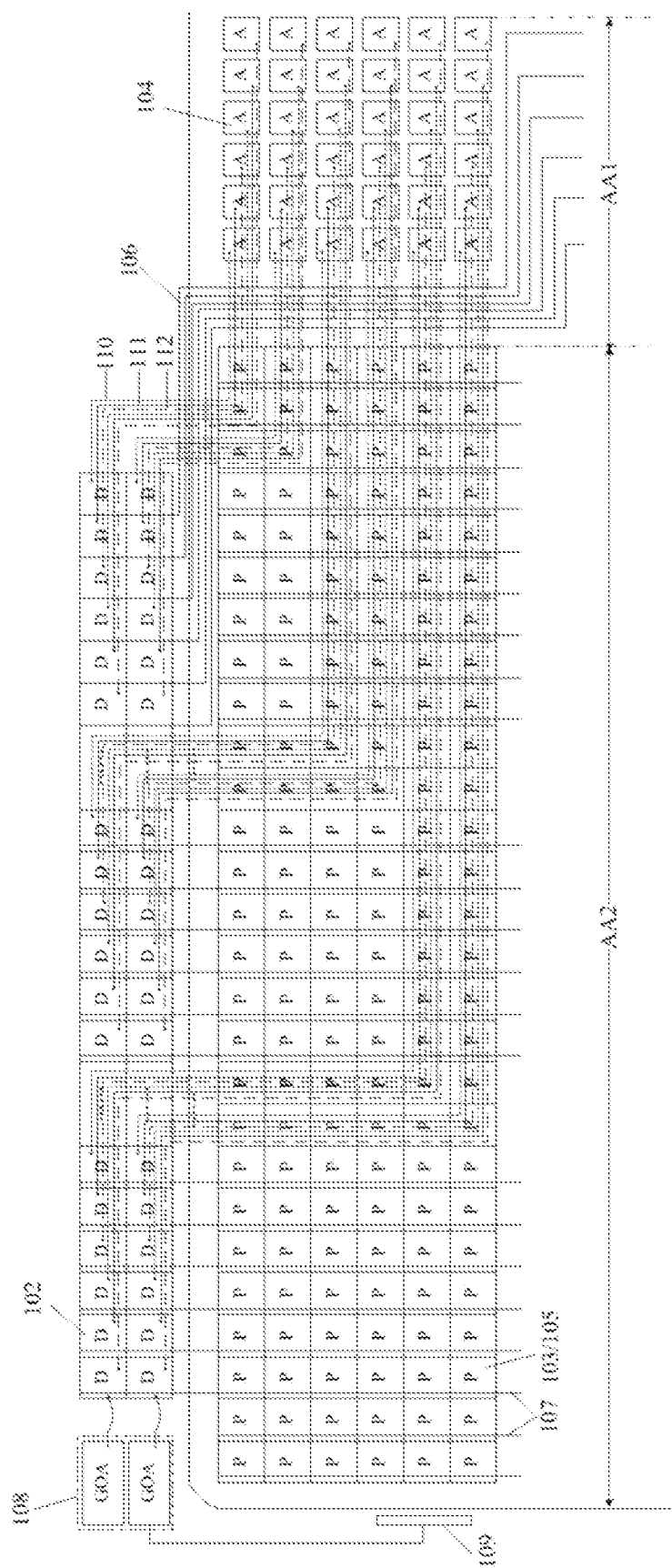
FIG. 14 is another enlarged structural schematic diagram of a region d in FIG. 3.
Figure 15:
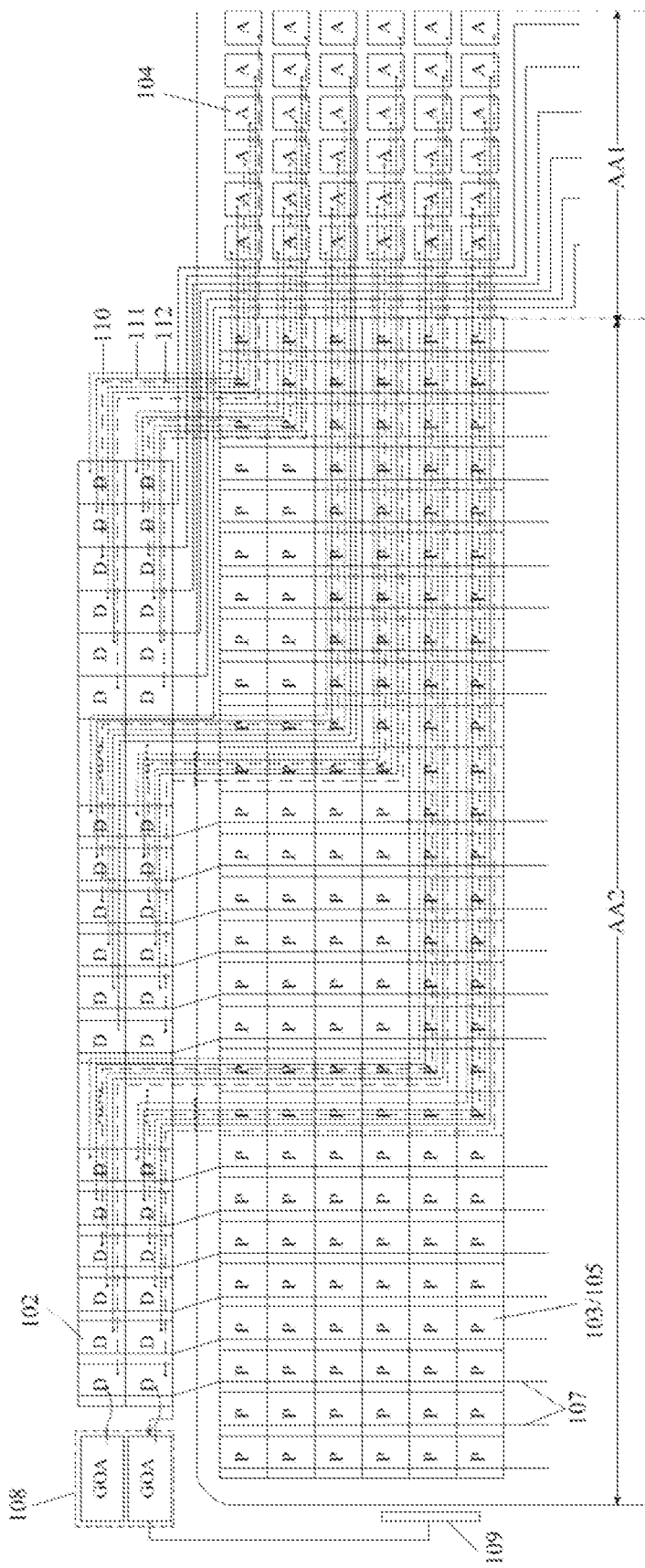
FIG. 15 is another enlarged structural schematic diagram of a region d in FIG. 3.
Figure 16:
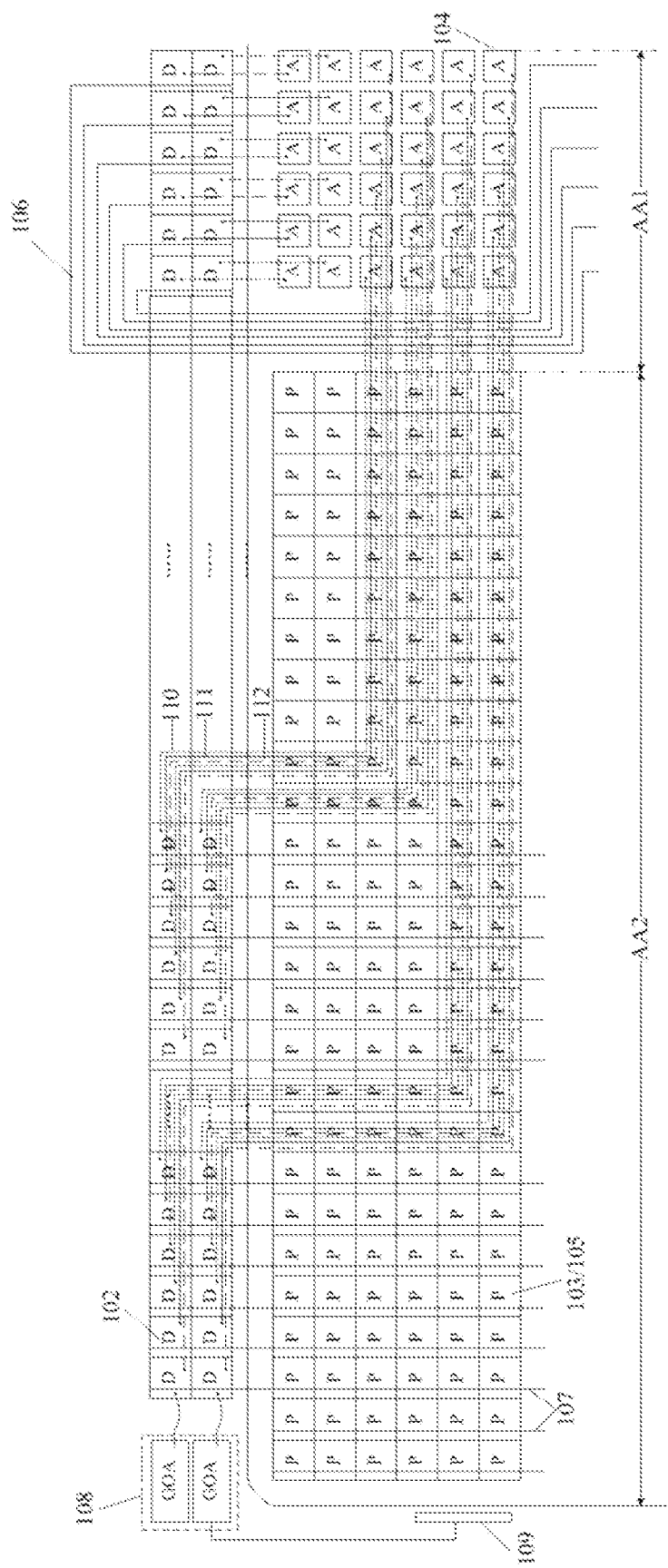
FIG. 16 is another enlarged structural schematic diagram of a region d in FIG. 3.
Figure 17:
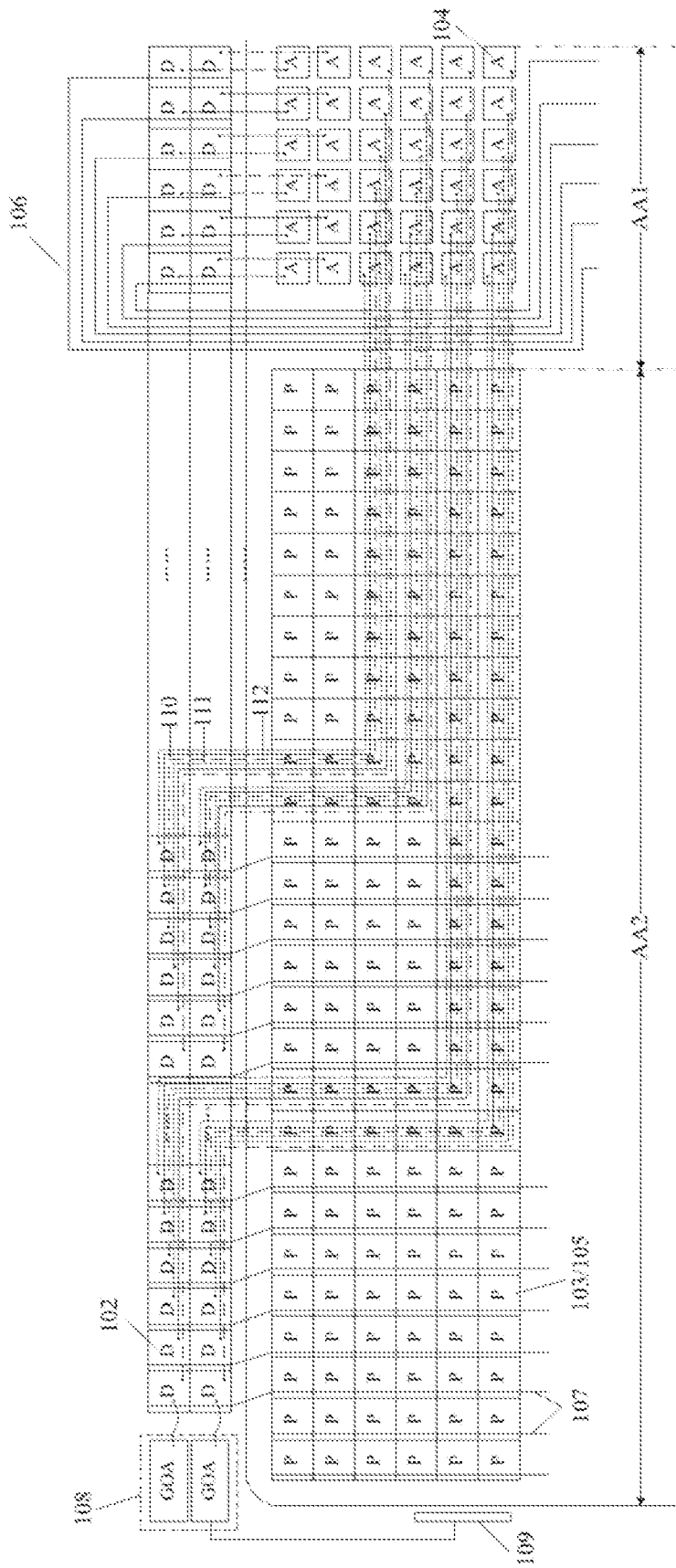
FIG. 17 is another enlarged structural schematic diagram of a region d in FIG. 3.
Figure 18:
FIG. 18 is another enlarged structural schematic diagram of a region d in FIG. 3.

Optionally, in the above-described display substrate provided by embodiments of the present disclosure, as shown in FIGS. 4, 12 and 13, the plurality of first data lines 106 may be bent along an edge of the first display region AA1 toward one sides, deviating from the second display region AA2, of the first pixel circuits 102; or, as shown in FIGS. 5, 14 and 15, the plurality of first data lines 106 may also be bent along the edge of the first display region AA1 toward one sides, close to the second display region AA2, of the first pixel circuits 102; or, as shown in FIGS. 16 and 17, the plurality of first data lines 106 may also be bent along the edge of the first display region AA1 toward one sides, deviating from the first display region AA1, of the first pixel circuits 102; or, as shown in FIGS. 18 and 19, the plurality of first data lines 106 may also be bent along the edge of the first display region AA1 toward one sides, close to the first display region AA1, of the first pixel circuits 102.

Optionally, in the above-described display substrate provided by embodiments of the present disclosure, the corresponding arrangement of one column of first pixel circuits 102 and one column of second pixel circuits 103 may specifically refer to: one column of first pixel circuits 102 and one column of second pixel circuits 103 are electrically connected to the same second data line 107 and are positioned in an opposite or staggered mode. Optionally, when one column of the first pixel circuits 102 and one column of the second pixel circuits 103 are disposed oppositely in the column direction, as shown in FIGS. 6, 8, 10, 12, 14, 16 and 18, one second data line 107 connecting the column of the first pixel circuits 102 and the column of the second pixel circuits 103 may be a straight line extending in the column direction. When one column of the first pixel circuits 102 and one column of the second pixel circuits 103 are disposed in a staggered mode in the column direction of the second display region AA2, as shown in FIGS. 7, 9, 11, 13, 15, 17, and 19, the plurality of second data lines 107 include oblique lines, the portion, connected with one column of the first pixel circuits 102, of one second data line 107 is a straight line extending in the column direction, the portion, connected with one column of the second pixel circuits 103, of the second data line 107 is a straight line extending in the column direction, and the portion, connected between one column of the first pixel circuits 102 and one column of the second pixel circuits 103, of the second data line 107 is an oblique line, that is, each second data line 107 is a broken line extending substantially in the column direction. When one column of the first pixel circuits 102 in the column direction of the first display region AA1 and one column of the second pixel circuits 103 in the second display region AA2 are correspondingly disposed, as shown in FIGS. 8 to 11, the portion, connected with one column of the first pixel circuits 102, of one second data line 107 is a straight line extending in the column direction, the portion, connected with one column of the second pixel circuits 103, of the second data line 107 is a straight line extending in the column direction, and the portion, connected between one column of the first pixel circuits 102 and one column of the second pixel circuits 103, of the second data line 107 is a broken line, for example, a broken line approximately in a Z shape. Of course, when one column of the first pixel circuits 102 in the column direction of the first display region AA1 and one column of the second pixel circuits 103 in the second display region AA2 are correspondingly disposed, as shown in FIGS. 20 and 21, it is also possible to load the first pixel circuits 102 with a data signal by separately disposing the first data lines 106 partially overlapping with the second display region AA2, which is not limited thereto. In addition, it should be noted that, as shown in FIGS. 4 and 5, when the second data lines 107 are only electrically connected with the second pixel circuits 103, the second data lines 107 are disposed in the same manner as that in the related art, specifically straight lines extending in the column direction.

Optionally, the first data lines 106 and the second data lines 107 may be formed of molybdenum, aluminum, silver, copper, titanium, platinum, tungsten, tantalum, tantalum nitride, alloys thereof, and combinations thereof.

Optionally, in the above-described display substrate provided by embodiments of the present disclosure, as shown in FIGS. 4 to 20, the drive circuit layer includes: a plurality of first shift register units 108 disposed in cascade in the bezel region BB, a plurality of second shift register units 109 disposed in cascade, a plurality of first control lines extending in the row direction and a plurality of second control lines extending in the row direction in the second display region AA2, wherein each first shift register unit 108 is electrically connected with one row of first pixel circuits 102 through one first control line;

each second shift register unit 109 is electrically connected with one row of second pixel circuits 103 through one second control line; and an operation time sequence of the first shift register units 108 corresponding to one row of the first pixel circuits 102 electrically connected with the first light emitting devices 104 contained in the row and an operation time sequence of the second shift register units 109 corresponding to the second pixel circuits 103 electrically connected with the second light emitting devices 105 contained in the row are the same, so that the first light emitting devices 104 and the second light emitting devices 105 on the same row emit light synchronously.

Optionally, the control lines in the present disclosure may be gate lines, reset signal lines and light emission control signal lines (EM). The control lines provide corresponding signals through the newly added first shift register units 108. Optionally, the gate lines, the reset signal lines and the light emission control signal lines may be formed of molybdenum, aluminum, silver, copper, titanium, platinum, tungsten, tantalum, nickel, alloys thereof, and combinations thereof.

Optionally, in the above-described display substrate provided by embodiments of the present disclosure, each light emitting device A refers to a portion where an anode, a light-emitting (EL) functional layer and a cathode overlap, optionally, the first light emitting devices 104 include first anodes, and the second light emitting devices 105 include second anodes; generally, the first anodes and the second anodes are opaque, so in order to improve the light transmittance of the first display region AA1 in which the first light emitting devices 104 are located, an orthographic projection area of the first anodes on the substrate 101 may be set to be smaller than an orthographic projection area of the second anodes when the light emitting colors of the first light emitting devices 104 and the second light emitting devices 105 are the same. Optionally, a ratio of the orthographic projection area of the first anodes on the substrate to the orthographic projection area of the second anodes corresponding to at least one same color as the first anodes is greater than or equal to 3/10 and less than or equal to 9/10, that is, the first light emitting devices 104 are downsized to 90-30%, such as 90%, 80%, 70%, 60%, 50%, 40% and 30%, of the second light emitting devices 105.

Optionally, in the above-described display substrate provided by embodiments of the present disclosure, the display substrate may further include: a plurality of transparent conductive layers stacked between the drive circuit layer and the light emitting device layer and insulated from each other; and each transparent conductive layer includes a plurality of transparent wirings (a plurality of first transparent wirings 110 of the same layer, a plurality of second transparent wirings 111 of the same layer, and a plurality of third transparent wirings 112 of the same layer are specifically shown in FIGS. 4 to 8), and each transparent wire is connected between the corresponding first pixel circuit 102 and the corresponding first light emitting device 104 in a one-to-one correspondence mode. Optionally, the transparent conductive layer may have a light transmittance of 40% to 100%, for example, 40%, 50%, 60%, 70%, 80%, 90%, and 100%.

Figure 2:
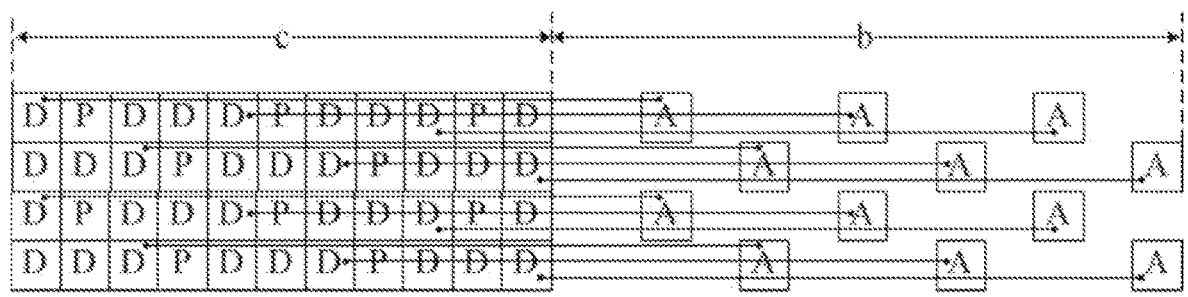
FIG. 2 is an enlarged structural schematic diagram of a region a in FIG. 1.

As shown in FIG. 2, in the related art, since each transparent wiring extending in the row direction has a certain width in the column direction and the size of pixels in the column direction is also certain, the number of pixels per row in the first display region AA1 is limited. The plurality of transparent conductive layers stacked and insulated from each other are adopted in the present disclosure, so that more transparent wirings may be provided within a certain size range in the column direction to drive more first light emitting devices 104, thereby satisfying the same resolution ratio as that of the second display region AA2.

Optionally, in the above-described display substrate provided by embodiments of the present disclosure, as shown in FIGS. 4 to 22, the plurality of transparent wirings included in each transparent conductive layer do not overlap with each other, and orthographic projections of the plurality of transparent wirings included in different transparent conductive layers on the substrate 101 do not overlap with each other. Of course, since the different transparent conductive layers are insulated from each other, optionally, the orthographic projections of the plurality of transparent wirings included in the different transparent conductive layers on the substrate 101 may overlap partially or completely, which is not limited thereto.

Optionally, in the above-described display substrate provided by embodiments of the present disclosure, in order to simplify the wiring design of the transparent conductive layers, as shown in FIG. 21, the plurality of transparent conductive layers may include a first transparent conductive layer, a second transparent conductive layer and a third transparent conductive layer which are stacked and insulated from each other, wherein the first transparent conductive layer includes a plurality of first transparent wirings 110, the second transparent conductive layer includes a plurality of second transparent wirings 111, and the third transparent conductive layer includes a plurality of third transparent wirings 112;

the plurality of first light emitting devices 104 include a plurality of first color light emitting devices R, a plurality of second color light emitting devices G and a plurality of third color light emitting devices B;

the first pixel circuits 102 include first sub-pixel circuits, second sub-pixel circuits and third sub-pixel circuits;

one ends of the first transparent wirings 110 are electrically connected with the first sub-pixel circuits, and the other ends of the first transparent wirings 110 are correspondingly and electrically connected with the first color light emitting devices R;

one ends of the second transparent wirings 111 are electrically connected with the second sub-pixel circuits, and the other ends of the second transparent wirings 111 are correspondingly and electrically connected with the second color light emitting devices G; and one ends of the third transparent wirings 112 are electrically connected with the third sub-pixel circuits, and the other ends of the third transparent wirings 112 are correspondingly and electrically connected with the third color light emitting devices B.

Figure 22:
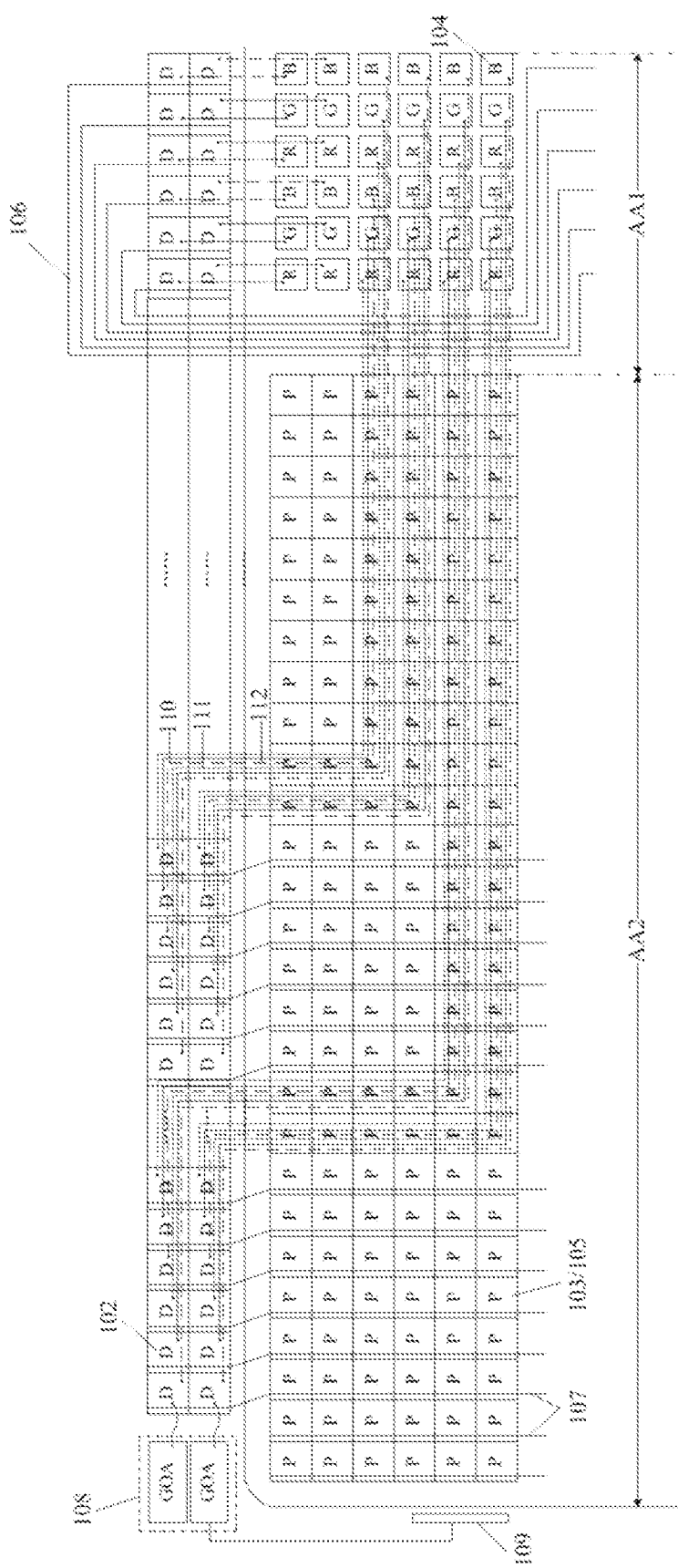
FIG. 22 is another enlarged structural schematic diagram of a region d in FIG. 3.

Optionally, as shown in FIG. 22, a plurality of first color light emitting devices R, a plurality of second color light emitting devices G and a plurality of third color light emitting devices B are sequentially circularly disposed column by column in the row direction; a plurality of first transparent wirings 110, a plurality of second transparent wirings 111 and a plurality of third transparent wirings 112 are correspondingly and electrically connected with the first pixel circuits 102 to be sequentially circularly disposed column by column in the row direction; the two first transparent wirings 110 electrically connected with two columns of the first pixel circuits 102 in two adjacent cycle periods are correspondingly and electrically connected with two adjacent columns of the first color light emitting devices R respectively; the two second transparent wirings 111 electrically connected with two columns of the first pixel circuits 102 in two adjacent cycle periods are correspondingly and electrically connected with two adjacent columns of the second color light emitting devices G respectively; and the two third transparent wirings 112 electrically connected with two columns of the first pixel circuits 102 in two adjacent cycle periods are correspondingly and electrically connected with two adjacent columns of the third color light emitting devices B respectively.

Optionally, in the above-described display substrate provided by embodiments of the present disclosure, as shown in FIG. 1, the first display region AA1 is configured to mount a light extraction module, such as a camera module.

Compared with the technical solution that both the light emitting devices A and the pixel circuits D exist in the first display region AA1 in the related art shown in FIG. 2, since only the light emitting devices A (i.e. the first light emitting devices 104) exist in the first display region AA1 in the present disclosure, a larger light-transmitting area can be provided, thereby facilitating adaptation to the camera module with a larger size.

Correspondingly, some embodiments of the present disclosure also provide a manufacturing method of the display substrate. Since the principle of solving the problem by the manufacturing method is similar to the principle of solving the problem by the display substrate, the implementation of the manufacturing method provided by the embodiments of the present disclosure can refer to the implementation of the display substrate provided by the embodiments of the present disclosure, and the repeated description is omitted.

Optionally, the manufacturing method of the display substrate provided by embodiments of the present disclosure may include the following steps:

Step 1, a drive circuit layer is manufactured on a substrate 101, wherein the drive circuit layer includes a plurality of first pixel circuits 102, a plurality of second pixel circuits 103, a plurality of first data lines 106, a plurality of second data lines 107, a plurality of first shift register units 108 disposed in cascade, a plurality of second shift register units 109 disposed in cascade, a plurality of first control lines (particularly including gate lines, reset signal lines and light emission control signal lines), and a plurality of second control lines (particularly including gate lines, reset signal lines and light emission control signal lines). Optionally, the first pixel circuits 102, the second pixel circuits 103, the first shift register units 108, and the second shift register units 109 may include transistors and capacitors. In a specific implementation, active layers (e.g., polysilicon, Poly) of the transistors, a gate insulating layer, gate electrodes of the transistors, first electrode plates of the capacitors, first control lines, second control lines, a first insulating layer, second electrode plates of the capacitors, an interlayer insulating layer, source/drain electrodes of the transistors, the first data lines 106 and the second data lines 107 may be sequentially formed on the substrate 101, wherein the gate electrodes of the transistors, the first electrode plates of the capacitors, the first control lines and the second control lines are disposed on the same layer, and the source/drain electrodes of the transistors, the first data lines 106 and the second data lines 107 are disposed on the same layer;

Step 2, the first insulating layer and a plurality of transparent conductive layers stacked and insulated from each other are sequentially formed on the drive circuit layer, optionally, the plurality of transparent conductive layers include a first transparent conductive layer composed of a plurality of first transparent wirings 110, a second transparent conductive layer composed of a plurality of second transparent wirings 111, and a third transparent conductive layer composed of a plurality of third transparent wirings 112. Optionally, in order to realize mutual insulation among the transparent conductive layers, a second insulating layer may be formed after the first transparent conductive layer is formed and before the second transparent conductive layer is formed, and a third insulating layer may be formed after the second transparent conductive layer is formed and before the third transparent conductive layer is formed;

Step 3, a fourth insulating layer, a plurality of first anodes and a plurality of second anodes disposed in the same layer, a pixel defining layer, a light-emitting functional layer, a cathode and an encapsulation layer are sequentially formed on the plurality of transparent conductive layers, wherein the plurality of first anodes and the plurality of second anodes, the light-emitting functional layer and the cathode form a light emitting device layer, specifically, the portions where the plurality of first anodes, the light-emitting functional layer and the cathode overlap with each other form a plurality of first light emitting devices 104, and the portions where the plurality of second anodes, the light-emitting functional layer and the cathode overlap with each other form a plurality of second light emitting devices 105.

In another aspect, some embodiments of the present disclosure also provide a display panel including the display substrate provided by embodiments of the present disclosure. Optionally, the display panel may be an organic electroluminescent display panel (OLED), a quantum dot light emitting display panel (QLED), or a micro light emitting diode display panel (Micro LED). Since the principle of solving the problem by the display panel is similar to the principle of solving the problem by the display substrate described above, the implementation of the display panel provided by the embodiments of the present disclosure can refer to the implementation of the display substrate described above provided by the embodiments of the present disclosure, and the repeated description is omitted.

In another aspect, some embodiments of the present disclosure also provide a display device, including: a light extraction module (such as a camera module) and the above-described display panel, wherein the light extraction module is disposed in the first display region AA1 of the display panel. Optionally, the light extraction module may be the camera module. The display device may be: any product or component with a display function, such as a mobile phone, a tablet computer, a television, a display, a notebook computer, a digital photo frame, a navigator, an intelligent watch, a body-building wrist strap, a personal digital assistant and the like. Other essential components of the display device should be understood by those of ordinary skill in the art and are not described in detail herein, nor should they be construed as limiting the present disclosure. In addition, since the principle of solving the problem by the display device is similar to the principle of solving the problem by the display panel described above, the implementation of the display device can refer to the embodiments of the display panel described above, and the repeated description is omitted.

According to the display substrate, the display panel and the display device provided by some embodiments of the present disclosure, the display substrate includes the substrate, wherein the display region of the substrate includes the first display region and the second display region at least located on one side of the first display region, and the light transmittance of the first display region is larger than that of the second display region; the drive circuit layer located on the substrate and including: the plurality of first pixel circuits located in the bezel region around the display region and the plurality of second pixel circuits located in the second display region; and the light emitting device layer located on one side, deviating from the substrate, of the drive circuit layer, wherein the light emitting device layer includes the plurality of first light emitting devices located in the first display region and the plurality of second light emitting devices located in the second display region, each of the plurality of first light emitting devices is correspondingly and electrically connected with each of the plurality of first pixel circuits, each of the plurality of second light emitting devices is correspondingly and electrically connected with each of the plurality of second pixel circuits, and a density (namely, the resolution ratio, PPI) of the plurality of first light emitting devices in the first display region is the same as a density of the plurality of second light emitting devices in the second display region. Since only the first light emitting devices exist in the first display region with the higher light transmittance, the driving signal of the first light emitting devices may be provided by the first pixel circuits in the bezel region and the density of the first light emitting devices in the first display region is the same as that of the second light emitting devices in the second display region, adverse effects caused by different resolution ratios of the first display region and the second display region are avoided, and the overall display effect is improved.

It will be apparent to those skilled in the art that various modifications and variations may be made to the embodiments of the present disclosure without departing from the spirit or scope of the embodiments of the present disclosure. Thus, it is intended that the present disclosure include the modifications and variations provided that these modifications and variations of the embodiments of the present disclosure fall within the scope of the appended claims of the present disclosure and their equivalents.

What is claimed is:

1. A display substrate, comprising:
    a substrate, wherein a display region of the substrate comprises a first display region and a second display region at least located on a side of the first display region, and a light transmittance of the first display region is larger than a light transmittance of the second display region;
    a drive circuit layer located on the substrate and comprising: a plurality of first pixel circuits located in a bezel region around the display region and a plurality of second pixel circuits located in the second display region; and
    a light emitting device layer located on a side, deviating from the substrate, of the drive circuit layer, wherein the light emitting device layer comprises a plurality of first light emitting devices located in the first display region and a plurality of second light emitting devices located in the second display region; each of the plurality of first light emitting devices is correspondingly and electrically connected with each of the plurality of first pixel circuits; each of the plurality of second light emitting devices is correspondingly and electrically connected with each of the plurality of second pixel circuits; and a density of the plurality of first light emitting devices in the first display region is same as a density of the plurality of second light emitting devices in the second display region;

wherein the drive circuit layer comprises: a plurality of first shift register units disposed in cascade in the bezel region, a plurality of second shift register units disposed in cascade, a plurality of first control lines extending in a row direction and a plurality of second control lines extending in a row direction in the second display region;

each of the first shift register units is electrically connected with one row of the first pixel circuits through one first control line; and each of the second shift register units is electrically connected with one row of the second pixel circuits through one second control line.

2. The display substrate according to claim 1, wherein the plurality of first pixel circuits are located in the bezel region adjacent to the plurality of first light emitting devices.

3. The display substrate according to claim 2, wherein at least part of columns in which the plurality of first pixel circuits are located are in one-to-one correspondence with at least part of columns in which the plurality of second pixel circuits are located.

4. The display substrate according to claim 3, wherein the drive circuit layer comprises: a plurality of first data lines and a plurality of second data lines;

in a column direction, at least part of each of the first data lines overlaps with the first display region, and each of the first data lines is correspondingly and electrically connected with at least one column of the first pixel circuits; and in a column direction, at least part of each of the second data lines overlaps with the second display region, and each of the second data lines is correspondingly and electrically connected with one column of the second pixel circuits.

5. The display substrate according to claim 4, wherein the plurality of first data lines are bent along an edge of the first display region toward a side, deviating from or close to the second display region, of the first pixel circuits; or, the plurality of first data lines are bent along an edge of the first display region toward a side, deviating from or close to the first display region, of the first pixel circuits.

6. The display substrate according to claim 4, wherein one second data line connecting the column of the first pixel circuits and the corresponding column of the second pixel circuits is a straight line extending in the column direction in response to that one column of the first pixel circuits and one corresponding column of the second pixel circuits are disposed opposite to each other in the column direction; or, the second data lines connecting the column of the first pixel circuits and the corresponding column of the second pixel circuits comprise oblique lines, in response to that one column of the first pixel circuits and one corresponding column of the second pixel circuits are staggered in the column direction of the second display region; or, the second data lines connecting the column of the first pixel circuits and the corresponding column of the second pixel circuits comprise broken lines, in response to that one column of the first pixel circuits in the column direction of the first display region and one column of the second pixel circuits in the second display region are correspondingly disposed.

7. The display substrate according to claim 3, wherein the drive circuit layer comprises: a plurality of second data lines, and in a column direction, at least part of each of the second data lines overlaps with the second display region, and each of the second data lines is correspondingly and electrically connected with at least one column of the first pixel circuits and one column of the second pixel circuits.

8. The display substrate according to claim 3, wherein the drive circuit layer comprises: a plurality of first data lines and a plurality of second data lines;

in a column direction, at least part of each of the first data lines overlaps with the first display region, and each of the first data lines is electrically connected with at least one column in which the first pixel circuits are located in a one-to-one correspondence mode; and in a column direction, at least part of each of the second data lines overlaps with the second display region, the plurality of second data lines are electrically connected with the columns in which the plurality of second pixel circuits are located in a one-to-one correspondence mode, and columns in which the first pixel circuits not being electrically connected with the first data lines are located are electrically connected with the second data lines of corresponding columns in which the second pixel circuits are located.

9. The display substrate according to claim 1, wherein the first light emitting devices comprise first anodes, and the second light emitting devices comprise second anodes; and an orthographic projection area of the first anodes on the substrate is smaller than that of the second anodes, in response to that a light emitting color of the first light emitting devices is the same as that of the second light emitting devices.

10. The display substrate according to claim 9, wherein a ratio of the orthographic projection area of the first anodes on the substrate to the orthographic projection area of the second anodes corresponding to at least one same color as the first anodes is greater than or equal to 3/10 and less than or equal to 9/10.

11. The display substrate according to claim 1, further comprises: a plurality of transparent conductive layers stacked between the drive circuit layer and the light emitting device layer and insulated from each other, each of the transparent conductive layers comprises a plurality of transparent wirings, and each transparent wiring is connected between a corresponding first pixel circuit and a corresponding first light emitting device in a one-to-one correspondence mode.

12. The display substrate according to claim 11, wherein the plurality of transparent wirings in each of the transparent conductive layers do not overlap with each other, and orthographic projections of the plurality of transparent wirings in different transparent conductive layers on the substrate do not overlap with each other or at least partially overlap with each other.

13. The display substrate according to claim 12, wherein the plurality of transparent conductive layers comprise a first transparent conductive layer, a second transparent conductive layer and a third transparent conductive layer which are stacked and insulated from each other, the first transparent conductive layer comprises a plurality of first transparent wirings, the second transparent conductive layer comprises a plurality of second transparent wirings, and the third transparent conductive layer comprises a plurality of third transparent wirings;

the plurality of first light emitting devices comprise a plurality of first color light emitting devices, a plurality of second color light emitting devices and a plurality of third color light emitting devices;

the first pixel circuits comprise first sub-pixel circuits, second sub-pixel circuits and third sub-pixel circuits;

one end of the first transparent wirings are electrically connected with the first sub-pixel circuits, and the other end of the first transparent wirings are correspondingly and electrically connected with the first color light emitting devices;

one end of the second transparent wirings are electrically connected with the second sub-pixel circuits, and the other end of the second transparent wirings are correspondingly and electrically connected with the second color light emitting devices; and one end of the third transparent wirings are electrically connected with the third sub-pixel circuits, and the other end of the third transparent wirings are correspondingly and electrically connected with the third color light emitting devices.

14. The display substrate according to claim 1, wherein the first display region is configured to mount a light extraction module.

15. A display panel, comprising: the display substrate according to claim 1.

16. A display device, comprising: a light extraction module and the display panel according to claim 15, wherein the light extraction module is disposed in the first display region of the display panel.

* * * * *